US011336297B2

(12) United States Patent
Horio et al.

(10) Patent No.: US 11,336,297 B2
(45) Date of Patent: May 17, 2022

(54) DMA TRANSFER APPARATUS, METHOD OF CONTROLLING THE SAME, COMMUNICATION APPARATUS, METHOD OF CONTROLLING THE SAME, AND NON-TRANSITORY COMPUTER-READABLE STORAGE MEDIUM

(71) Applicant: CANON KABUSHIKI KAISHA, Tokyo (JP)

(72) Inventors: Daisuke Horio, Tokyo (JP); Koji Churei, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/029,248

(22) Filed: Sep. 23, 2020

(65) Prior Publication Data
US 2021/0006264 A1 Jan. 7, 2021

Related U.S. Application Data

(62) Division of application No. 16/213,024, filed on Dec. 7, 2018, now Pat. No. 10,833,703.

(30) Foreign Application Priority Data

Dec. 13, 2017 (JP) .............................. JP2017-238920
Mar. 16, 2018 (JP) .............................. JP2018-048725
Aug. 1, 2018 (JP) .............................. JP2018-144954

(51) Int. Cl.
*H03M 13/09* (2006.01)
*G06F 11/10* (2006.01)
(Continued)

(52) U.S. Cl.
CPC ....... *H03M 13/096* (2013.01); *G06F 11/1004* (2013.01); *G06F 13/1668* (2013.01); *G06F 13/28* (2013.01); *G06F 2213/28* (2013.01)

(58) Field of Classification Search
CPC .. G06F 13/28; G06F 11/1004; G06F 13/1668; G06F 2213/28; H03M 13/093; H03M 13/096
See application file for complete search history.

(56) References Cited

U.S. PATENT DOCUMENTS 5,379,381 A * 1/1995 Lamb ..................... G06F 13/28
710/24
8,495,241 B2 7/2013 Wu
(Continued)

FOREIGN PATENT DOCUMENTS

JP H06078024 A 3/1994
JP H11126181 A 5/1999
(Continued)

OTHER PUBLICATIONS

Office Action issued in Japanese Appln No. 2017-238920 dated Jul. 12, 2021.
(Continued)

*Primary Examiner* — Steve N Nguyen
(74) *Attorney, Agent, or Firm* — Rossi, Kimms & McDowell LLP

(57) ABSTRACT

A DMA (Direct Memory Access) transfer apparatus acquires information including a transfer source address and a transfer destination address based on a received transfer instruction, selects whether to perform first checksum calculation for data from an area of a memory corresponding to the transfer source address or perform second checksum calculation different from the first checksum calculation, and transfers data obtained via the checksum calculation selected in the selecting to an area of the memory corresponding to the transfer destination address.

14 Claims, 15 Drawing Sheets

(51) Int. Cl.
*G06F 13/28* (2006.01)
*G06F 13/16* (2006.01)

(56) References Cited

U.S. PATENT DOCUMENTS

| | | | | |
|---|---|---|---|---|
| 8,996,926 | B2* | 3/2015 | Brewerton | G06F 11/1048 |
| | | | | 714/52 |
| 9,042,244 | B2 | 5/2015 | Senga | |
| 9,898,230 | B2 | 2/2018 | Watanabe | |
| 10,049,001 | B1 | 8/2018 | Johnson | |
| 10,191,871 | B2* | 1/2019 | Cottam | G06F 13/1642 |
| 10,701,041 | B2 | 6/2020 | Suzuki | |
| 2003/0105977 | A1 | 6/2003 | Brabson | |
| 2004/0123221 | A1 | 6/2004 | Huffman | |
| 2005/0089031 | A1 | 4/2005 | Krueger | |
| 2008/0147908 | A1* | 6/2008 | Lahti | G06F 11/1004 |
| | | | | 710/23 |
| 2008/0195900 | A1* | 8/2008 | Chang | G11C 7/1006 |
| | | | | 714/718 |
| 2009/0271536 | A1* | 10/2009 | Tiennot | G06F 13/28 |
| | | | | 710/28 |
| 2010/0058155 | A1 | 3/2010 | Wu | |
| 2010/0095193 | A1 | 4/2010 | Moltchanov | |
| 2010/0299565 | A1 | 11/2010 | Muro | |
| 2016/0014004 | A1 | 1/2016 | Bergeron | |
| 2016/0337083 | A1 | 11/2016 | Englert | |
| 2017/0111483 | A1 | 4/2017 | Wang | |
| 2018/0121282 | A1* | 5/2018 | Barrilado Gonzalez | G06F 11/1004 |
| 2018/0143872 | A1 | 5/2018 | Sun | |

FOREIGN PATENT DOCUMENTS

| | | |
|---|---|---|
| JP | 2006303765 A | 11/2006 |
| JP | 2010057033 A | 3/2010 |
| JP | 2015207223 A | 11/2015 |
| JP | 2017103734 A | 6/2017 |
| JP | 2017108357 A | 6/2017 |
| WO | 2010073671 A1 | 7/2010 |

OTHER PUBLICATIONS

Notice of Allowance issued in U.S. Appl. No. 16/213,024 dated Jul. 15, 2020.

L. Jie, C. Shuhui and S. Jinshu, "Implementation of TCP large receive offload on multi-core NPU platform," 2016 International Conference on Information and Communication Technology Convergence (ICTC), Jeju, 2016, pp. 258-263.

* cited by examiner

DMA TRANSFER APPARATUS, METHOD OF CONTROLLING THE SAME, COMMUNICATION APPARATUS, METHOD OF CONTROLLING THE SAME, AND NON-TRANSITORY COMPUTER-READABLE STORAGE MEDIUM

BACKGROUND OF THE INVENTION

Field of the Invention

The present invention relates to a DMA transfer apparatus, a method of controlling the same, a communication apparatus, a method of controlling the same, and a non-transitory computer-readable storage medium.

Description of the Related Art

Communication protocols most frequently used for data communication on the Internet or an intranet are TCP/IP and UDP/IP. TCP/IP is a communication protocol that defines a guarantee for the order of communication packets and retransmission control at a time of packet loss. On the other hand, UDP/IP is a communication protocol that does not define a guarantee for the order of communication packets or recovery processing for a loss of communication packets. Note that TCP/IP represents Transmission Control Protocol/Internet Protocol. In addition, UDP/IP represents User Datagram Protocol/Internet Protocol.

These communication protocols use checksums to inspect the integrity of communication packets. Simply speaking, a checksum is the sum of data rows calculated on the transmission side. On the transmission side, the checksum is added to transmission data and transmitted. On the reception side, the sum of received data rows is calculated. If the sum does not match the added checksum, an error is determined.

In each of the above-described communication protocols, an Internet checksum calculated using the specific field of an IP header and a TCP/UDP header and a payload is used. Internet checksum calculation in a PC (Personal Computer) or an embedded device is implemented by software processing by a CPU (Central Processing Unit) or the hardware of a NIC (Network Interface Card) or an intra-chip communication unit.

The checksum calculation has a large processing load. For this reason, when an embedded device whose CPU has a low processing capability calculates a checksum, the communication speed may lower. Against this, calculating a checksum by an NPU (Network Processing Unit) or a hardware calculator dedicated to communication processing has been conventionally proposed. This reduces the processing load and speeds up the calculation processing. In a PC as well, a checksum is calculated by hardware such as a NIC for the purpose of reducing the load on the CPU. For example, Japanese Patent Laid-Open No. 6-78024 proposes a method of implementing reduction of a load on a processor in a system by calculating a checksum when transferring a network packet from a storage device to a packet buffer in a network adapter.

In addition, there has been proposed a technique of combining a checksum calculator and a DMA (Direct Memory Access) transfer apparatus and calculating a checksum during DMA data transfer, thereby speeding up communication processing throughout a system in a device. Japanese Patent Laid-Open No. 2006-303765 proposes a method of calculating two checksums when performing DMA transfer between a buffer that stores a datagram from an application layer and the buffer of a communication unit. Here, the two checksums are the header checksum of IP and a checksum of UDP or TCP.

Additionally, one of techniques of reducing the load generated on the CPU in the above-described TCP/IP protocol processing and speeding up packet transmission processing is TSO (TCP Segmentation Offload) processing. In the TSO processing, user data transferred to a buffer is read out in a size larger than the transmission unit and divided into a plurality of transmission data, and a TCP header, an IP header, and the like are added to each of the plurality of divided transmission data, thereby generating a plurality of packets at once. The TSO processing offloads packet generation processing from the CPU to, for example, hardware such as a NIC (Network Interface Card). Header generation and addition processing which occurs for each packet is sped up by the offload.

International Publication No. 2010/073671 discloses a TCP transmission control apparatus capable of controlling whether to use TSO processing on a TCP session (application) basis depending on the presence/absence of a packet loss or an application.

As described above, during DMA transfer of a datagram (payload) from an application layer, the sum (payload sum) of payloads is calculated to thereby calculate an Internet checksum using the payload sum. It is therefore possible to increase the communication speed. However, if the payload length is changed during the DMA transfer, the payload sum cannot be used when calculating the Internet checksum, and the communication speed lowers.

In addition, a payload sum speculatively calculated at the time of storage in a buffer is not always usable in plural packet generation. For example, in a case in which a sum is calculated for entire user data stored in one buffer, and the user data stored in the buffer is partially untransmitted, the payload sum needs to be recalculated at the time of packet generation. In this case, a load to read out the user data to be transmitted and recalculate the payload sum is generated, and this may impede speedup of the packet generation processing. In particular, since the above-described TSO processing reads out user data of a large size from a buffer and generates a plurality of packets at once, cases in which the payload sum needs to be recalculated may unnecessarily increase.

SUMMARY OF THE INVENTION

The present invention provides a technique for efficiently calculating a checksum in consideration of the above-described problem.

According to one aspect of the present invention, there is provided a DMA (Direct Memory Access) transfer apparatus which comprises: an acquisition unit configured to acquire information including a transfer source address and a transfer destination address based on a received transfer instruction; a first calculation unit configured to perform first checksum calculation for data from an area of a memory corresponding to the transfer source address; a second calculation unit configured to perform second checksum calculation different from the first checksum calculation for the data from the area of the memory corresponding to the transfer source address; a selection unit configured to select one of the first calculation unit and the second calculation unit; and a transfer unit configured to transfer data obtained via the calculation by one of the first calculation unit and the second calculation unit, which is selected by the selection unit, to an area of the memory corresponding to the transfer destination address.

Further features of the present invention will become apparent from the following description of exemplary embodiments with reference to the attached drawings.

DESCRIPTION OF THE EMBODIMENTS

The present invention will now be described in detail with reference to the accompanying drawings based on examples of embodiments. Note that the arrangements shown in the embodiments are merely examples, and the present invention is not limited to the illustrated arrangements.

First Embodiment (Arrangement of Communication Apparatus 100)

Figure 1:
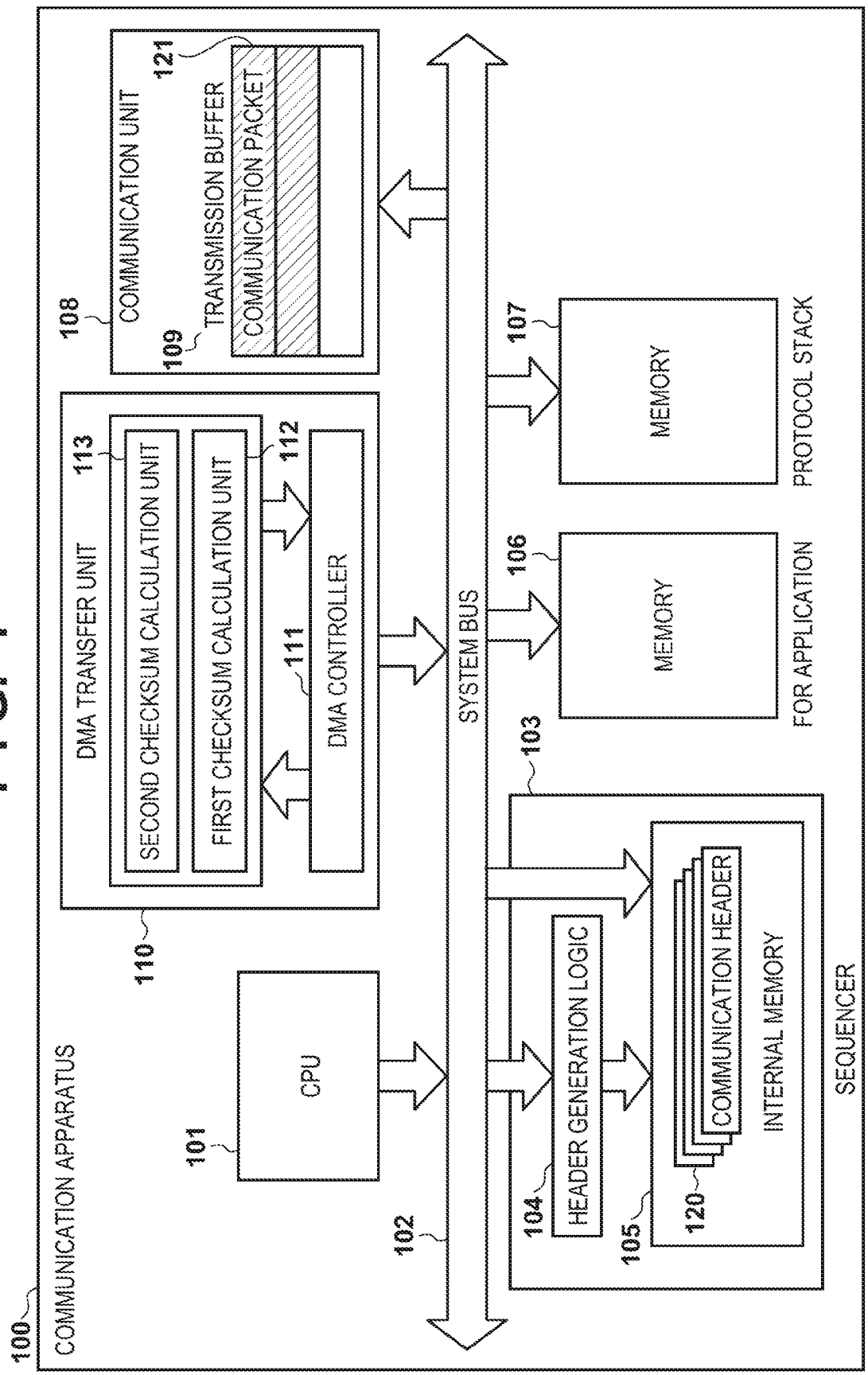
FIG. 1 is a block diagram showing the schematic arrangement of a communication apparatus 100.

FIG. 1 is a block diagram showing the schematic arrangement of the communication apparatus 100 according to an embodiment to be described below. A CPU 101 controls each functional block, each piece of software, and each piece of hardware included in the communication apparatus 100. In this embodiment, the CPU 101 controls two pieces of software, that is, an application and a protocol stack. The application is software that operates when uploading the data of a captured image or moving image to the Internet or a media server in a case in which the communication apparatus 100 is assumed to be a camera or a camcorder. The protocol stack is software that performs communication protocol processing such as TCP (UDP)/IP. More specifically, the protocol stack performs retransmission control and order guarantee for packets in TCP (UDP)/IP communication and a communication packet integrity inspection using a checksum. In addition, the protocol stack generates a TCP (UDP) header and an IP header, which are communication headers configured to implement these functions.

A memory 106 is a memory area used by the application. The memory 106 stores, for example, the data of a moving image or the like output from the application. On the other hand, a memory 107 is a memory area used by the protocol stack. The memory 107 is used as, for example, a temporary data copy area used to generate a packet from moving image data by the protocol stack or an area used to generate a communication header. Note that although the memory 106 and the memory 107 are separated formed in FIG. 1, these memories may be formed by a single memory, and the use areas of the pieces of software may be managed using memory addresses.

Data to be used by or output from the application is input/output to/from the memory 106 via a system bus 102. Data exchange (data transfer/copy) between the storage areas (the memory 106, the memory 107, an internal memory 105 of a sequencer 103, and a transmission buffer 109 in a communication unit 108) is executed via the system bus 102 by the CPU 101 or a DMA controller 111 in a DMA transfer unit 110. In addition, data exchange between hardware blocks in the communication apparatus 100 is performed via the system bus 102.

The DMA transfer unit 110 is formed by a first checksum calculation unit 112, a second checksum calculation unit 113, and the DMA controller 111. The first checksum calculation unit 112 calculates the sum (to be referred to as a payload sum hereinafter) of datagrams. The second checksum calculation unit 113 calculates an Internet checksum. The calculation amount in the calculation of the payload sum is smaller than the calculation amount in the calculation of the Internet checksum. More specifically, the payload sum is the sum of 1's complements for every 16-bit word of an input datagram. The Internet checksum is the 1's complement of the sum of 1's complements for every 16-bit word in RFC (Request for Comments) 791, RFC 793, RFC 2460, and RFC 1071 defined by the IETF (Internet Engineering Task Force). More specifically, the Internet checksum according to this embodiment is an inversion (1's complement of 16 bits) of the sum (the sum of the 1's complements of the 16-bit word) of a pseudo header, a TCP header, and a payload (all headers and texts). Here, the pseudo header can be formed by an SRC (transmission source) address, a DST (destination) address, a protocol No. (number) and a TCP length.

With this arrangement, the DMA transfer unit 110 can calculate the payload sum and the Internet checksum during DMA transfer. In addition, the DMA transfer unit 110 can also simply operate as a DMA transfer device without performing checksum calculation.

The DMA transfer unit 110 selects one of the first checksum calculation unit 112 and the second checksum calculation unit 113 based on, for example, the value of a register set by the CPU 101 or the sequencer 103. In addition, the DMA transfer unit 110 reads out a descriptor from a memory area designated by the value of the register and performs DMA transfer or DMA transfer with checksum calculation based on the descriptor. In the following explanation, register setting performed for DMA transfer will be referred to as a transfer instruction, and DMA transfer with checksum calculation will be referred to as a calculation transfer instruction. An area of a memory is designated in the value of the register set in the DMA transfer unit 110. The DMA transfer unit 110 operates in accordance with a descriptor stored in the designate memory area. The descriptor is information necessary when the DMA transfer unit 110 performs DMA transfer, and includes at least a transfer source address, a transfer destination address, and a data length. That is, the DMA transfer unit acquires information including a transfer source address and a transfer destination address based on a received calculation transfer instruction or transfer instruction.

The sequencer 103 is control hardware capable of performing data connection or data division upon receiving a predetermined instruction together with a request to substitutionally perform the calculation transfer instruction, as will be described later. For example, upon receiving an instruction to perform data division together with a request to substitutionally perform the calculation transfer instruction, the sequencer 103 divides a datagram on an MSS (Maximum Segment Size) basis. Note that the MSS is the maximum data size that is set when dividing a datagram output from the application into a size transmittable on the communication protocol at the time of communication packet generation. Next, a header generation logic 104 in the sequencer 103 generates a communication header for each of divided/connected data. After the communication header for each of the divided/connected data is generated, the sequencer 103 generates a descriptor to DMA-transfer each divided/connected data and the generated communication header to the transmission buffer 109 and form a communication packet. The generated descriptor is stored in the memory 106. After storing the descriptor in the memory 106, the sequencer 103 issues a transfer instruction to the DMA transfer unit 110.

The communication unit 108 communicates with an external device. More specifically, the communication unit 108 processes an MAC (Media Access Control) layer and a PHY layer necessary for communication.

(DMA Transfer Operation when First Checksum Calculation Unit 112 is Used)

Figure 2:
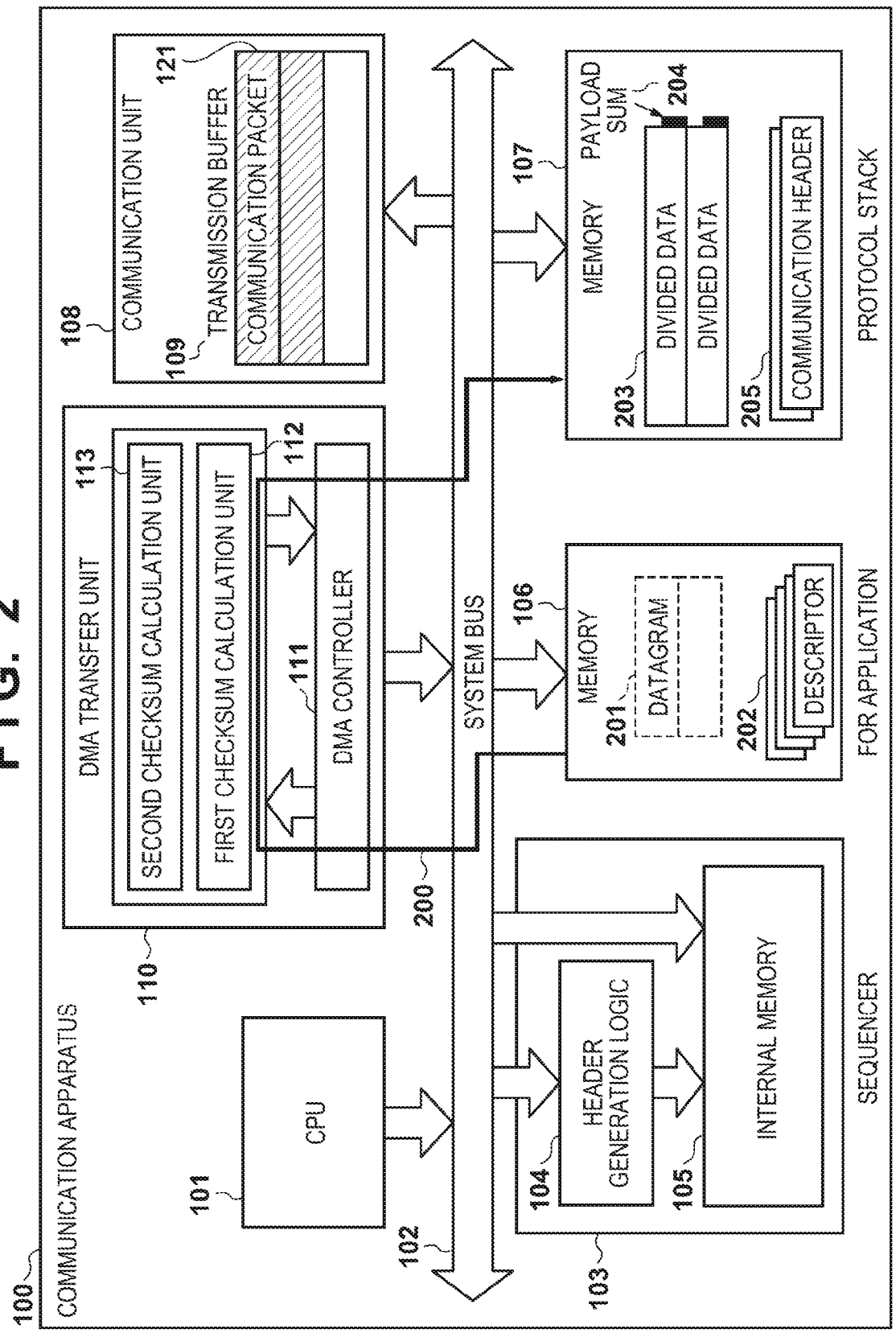
FIG. 2 shows an example of DMA transfer when a first checksum calculation unit 112 is used.

FIG. 2 shows an example of DMA transfer when the first checksum calculation unit 112 according to this embodiment is used. An operation including calculating a payload sum using the first checksum calculation unit 112 when the DMA transfer unit 110 DMA-transfers a datagram output from the application to the memory 106 to the memory 107 used by the protocol stack will be described below.

In the CPU 101, after the application outputs a datagram 201 to the memory 106, the task is switched to the protocol stack. The protocol stack generates descriptors 202 to DMA-transfer the datagram 201 stored in the memory 106. If the descriptor is smaller than the MSS, the protocol stack generates, as the descriptors 202, a descriptor whose transfer length equals the size of the datagram 201 and a descriptor having a transfer length of 2 bytes for a payload sum. The protocol stack stores the generated descriptors 202 in the memory 106.

On the other hand, if the datagram 201 is larger than the MSS, a payload sum needs to be calculated on the MSS basis. Hence, the protocol stack divides the datagram on the MSS basis. Next, the protocol stack generates, as the descriptors 202, a plurality of descriptors each having a transfer length equal to the MSS, a descriptor whose transfer length equals the data size of a remainder of the division based on the MSS, and a descriptor for the payload sum of each divided data. The protocol stack stores the generated descriptors 202 in the memory 106.

Note that the protocol stack may separately generate the descriptors 202 for read and the descriptors 202 for write. For example, the protocol stack may generate the descriptors for the divided data as the descriptors 202 for read. In addition, the protocol stack may generate the descriptors for division and the descriptors for payload sums as the descriptors 202 for write. Here, the protocol stack may put the descriptors for divided data and the descriptors for payload sums together into one descriptor as the descriptor 202 for write by adding their transfer lengths.

After the descriptors 202 are generated, the protocol stack issues a calculation transfer instruction to the DMA transfer unit 110. That is, the protocol stack sets, in the register of the DMA transfer unit 110, a value representing using of the first checksum calculation unit 112 and the memory area to store the descriptors. The DMA transfer unit 110 decides to use the first checksum calculation unit 112 in accordance with the value set in the register. Note that by a method other than determining the value set in the register, the DMA transfer unit 110 may decide to use the first checksum calculation unit 112. For example, the DMA transfer unit 110 may detect the calculation transfer instruction from the protocol stack based on a transaction ID or the address of a register access source on the system bus 102 and decide to use the first checksum calculation unit 112. Alternatively, the DMA transfer unit 110 may determine to use the first checksum calculation unit 112 based on the combination of the transfer source address and the transfer destination address of the descriptors 202.

In the DMA transfer unit 110 that receives the calculation transfer instruction from the CPU 101 (protocol stack), the internal DMA controller 111 reads out the descriptors 202 stored in the memory 106 based on the value set in the register. Next, the DMA controller 111 reads out divided data 203 with the transfer length described in the descriptor 202 from the memory 106. The first checksum calculation unit 112 calculates a payload sum 204 of the readout divided data. The payload sum 204 is added to the end of the divided data 203. The DMA transfer unit 110 writes this in the memory 107 in accordance with the descriptor 202.

Next, the protocol stack calculates an Internet checksum from the payload sum 204 stored in the memory 107. After that, the protocol stack generates a communication header 205 including the Internet checksum corresponding to each divided data 203 and stores it in the memory 107. In addition, the protocol stack generates a descriptor to DMA-transfer the divided data 203 and the communication header 205 from the memory 107 to the transmission buffer 109. After generation of the descriptor, the protocol stack issues a transfer instruction to the DMA transfer unit 110. In response to this, the DMA transfer unit 110 transfers the divided data 203 and the communication header 205 to the transmission buffer 109 of the communication unit 108.

The communication unit 108 transmits a communication packet 121 formed by the divided data 203 and the communication header 205 written in the transmission buffer 109 to an external device.

(DMA Transfer Operation when Second Checksum Calculation Unit 113 is Used)

Figure 3:
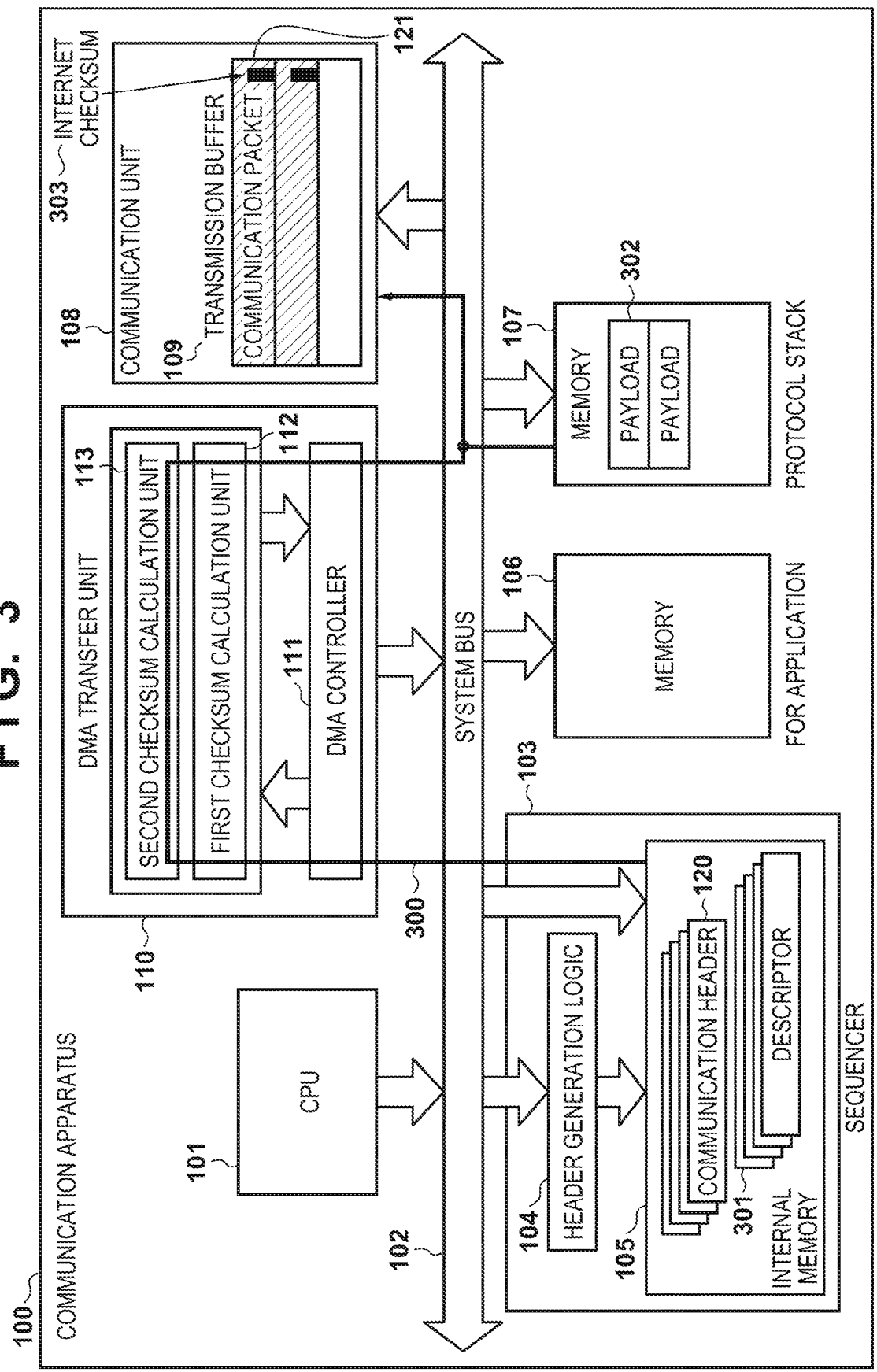
FIG. 3 shows an example of DMA transfer when a second checksum calculation unit 113 is used.

FIG. 3 shows an example of DMA transfer when the second checksum calculation unit 113 according to this embodiment is used. Here, assume a case in which after the datagram from the application is DMA-transferred from the memory 106 to the memory 107 while performing payload sum calculation, the protocol stack (CPU 101) determines to change the payload length. In this case, the Internet checksum cannot be calculated using the payload sum. The case in which the payload length is changed is, for example, a case in which datagrams are connected or a case in which the MSS is changed. An operation in which the DMA transfer unit 110 calculates the Internet checksum using the second checksum calculation unit 113 in such a case will be described.

First, after the datagram from the application is DMA-transferred from the memory 106 to the memory 107, upon determining to change the payload length, the protocol stack notifies the sequencer 103 that a calculation transfer instruction should substitutionally be performed. The protocol stack notifies the sequencer 103 of an instruction concerning data division/connection together with the request to substitutionally perform the calculation transfer instruction. For example, if the datagram from the application is smaller than the MSS, the protocol stack determines whether it can be connected to the next data. Upon determining that the data can be connected, the protocol stack notifies the sequencer 103 of a data connection instruction together with the request to substitutionally perform the calculation transfer instruction. In addition, when the MSS changes after the timing of transfer of the datagram from the application, the protocol stack notifies the sequencer 103 of an instruction to perform data division based on the new MSS together with the request to substitutionally perform the calculation transfer instruction.

The sequencer 103 performs data connection or data division in accordance with the notification from the protocol stack. Next, the sequencer 103 generates, by the header generation logic 104, a communication header 120 in which the field of an Internet checksum 303 is uncalculated and stores the communication header 120 in the internal memory 105. The sequencer 103 also generates a descriptor 301 used to DMA-transfer the communication header 120, a payload 302 to be stored in the memory 107, and the Internet checksum 303 (generated by the second checksum calculation unit 113) to the transmission buffer. Here, the transfer destination address of the Internet checksum 303 is set by referring to the checksum field in the communication header after DMA transfer such that the communication packet 121 is completed when the transfer to the transmission buffer 109 of the communication unit 108 is completed.

After generation of the descriptor 301, the protocol stack issues a calculation transfer instruction to the DMA transfer unit 110. That is, the protocol stack sets, in the register of the DMA transfer unit 110, a value representing using of the second checksum calculation unit 113 and the memory area to store the descriptor 301. The DMA transfer unit 110 decides to use the second checksum calculation unit 113 in accordance with the value set in the register. Here, as in using the first checksum calculation unit 112, the DMA transfer unit 110 may detect the calculation transfer instruction from the sequencer 103 based on a transaction ID or the address of a register access source on the system bus and decide to use the second checksum calculation unit 113. Alternatively, the DMA transfer unit 110 may determine to use the second checksum calculation unit 113 based on the combination of the transfer source address and the transfer destination address of the descriptor 301.

The communication unit 108 transmits the communication packet 121 formed by the payload 302 and the communication header 120 including the Internet checksum 303 written in the transmission buffer 109 to an external device.

(Operation of CPU 101)

Figure 4:
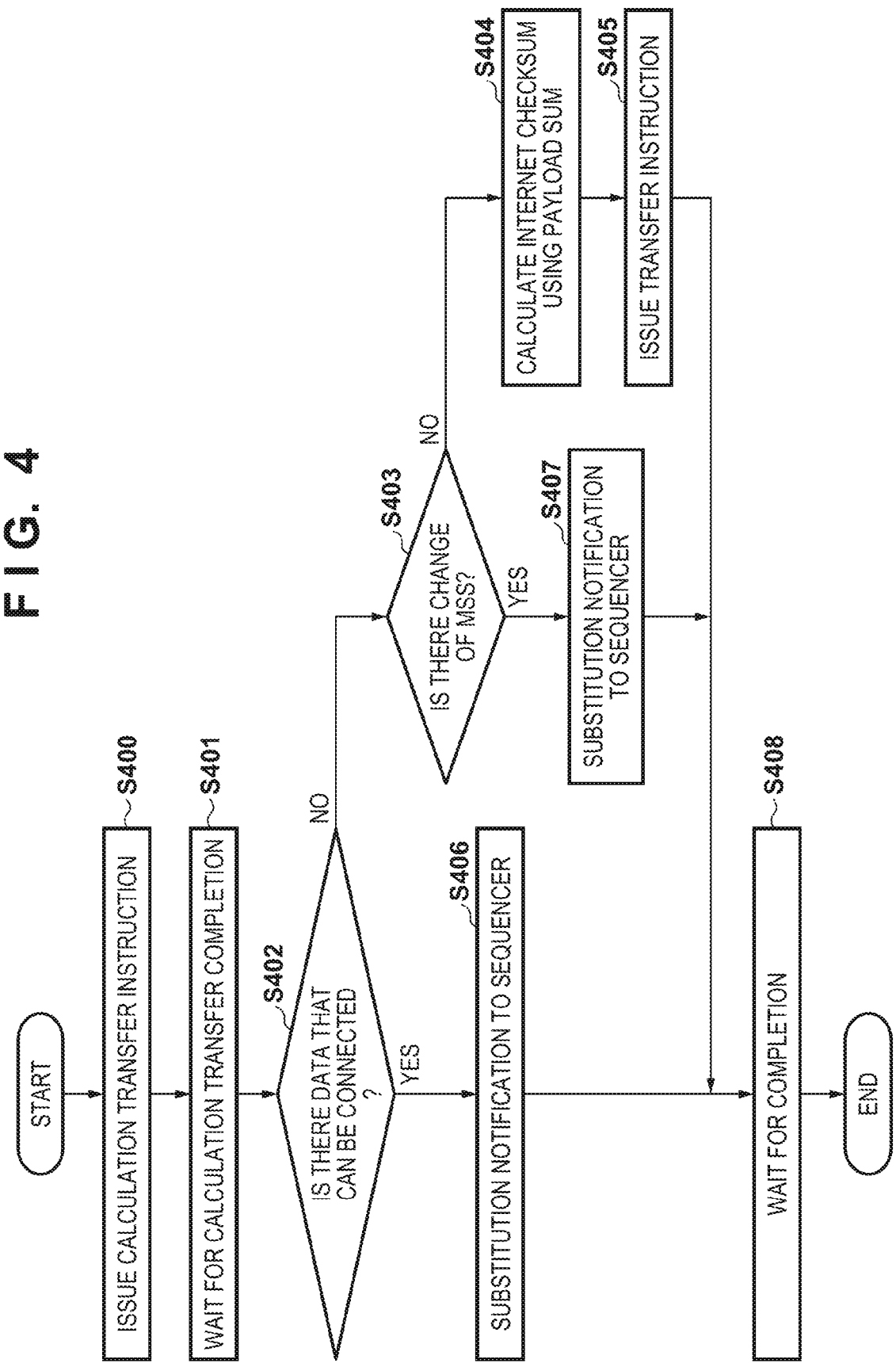
FIG. 4 is a flowchart of processing of a CPU 101 according to the first embodiment.

FIG. 4 is a flowchart of processing of the CPU 101 (protocol stack) according to this embodiment. A description will be made here concerning a flowchart for switching the operation depending on whether to change the payload length after the datagram from the application is DMA-transferred from the memory 106 to the memory 107 while performing payload sum calculation.

In step S400, the protocol stack issues, to the DMA transfer unit 110, a calculation transfer instruction to transfer (copy) a datagram from the application from the memory 106 to the memory 107 used by the protocol stack while performing payload sum calculation. At the time of datagram transfer, if the data size is larger than the MSS, the datagram is divided on the MSS basis and DMA-transferred. That is, a payload sum is calculated for each of data divided on the MSS basis. If the data size is equal to or smaller than the MSS, the data is transferred in the size of the datagram notified from the application.

In step S401, the protocol stack waits for a notification of calculation transfer completion from the DMA transfer unit 110 to the calculation transfer instruction issued in step S400. For example, the protocol stack waits for interrupt from the DMA transfer unit 110. Note that the protocol stack may determine the calculation transfer completion by polling the register of the DMA controller 111.

In step S402, the protocol stack compares the length of the datagram from the application with the MSS. If the length of the datagram is equal to or less than the MSS, the protocol stack determines whether the datagram can be connected to the next datagram from the application. If the length of the datagram is equal to or less than the MSS even after it is connected to the next datagram, the protocol stack determines that the datagram can be connected (YES in step S402), and advances to the process of step S406. If the length of the datagram is equal to the MSS, or if the length of the datagram is less than the MSS but exceeds the MSS after it is connected to the next datagram, the protocol stack determines that the datagram cannot be connected (NO in step S402), and advances to the process of step S403.

In step S403, the protocol stack determines whether the communication state changes, and the MSS changes from before the transfer of the datagram from the application. For example, the protocol stack determines whether the MSS changes in TCP in a received SYN (synchronous) packet. If the MSS changes (YES in step S403), the protocol stack advances to the process of step S407. If the MSS does not change (NO in step S403), the protocol stack advances to the process of step S404.

In step S404, the protocol stack calculates the Internet checksum by referring to each field value on the communication header using the payload sum calculated by the first checksum calculation unit 112 at the time of data transfer from the memory 106, as described with reference to FIG. 2. In addition, after the calculation of the Internet checksum, the protocol stack writes it back to the checksum field of the communication header. In step S405, the protocol stack issues a transfer instruction to the DMA transfer unit 110. Next, in step S408, the protocol stack waits for a transfer completion notification from the DMA transfer unit 110 to the transfer instruction. Here, the protocol stack can detect the transfer completion by an interrupt or polling.

On the other hand, if it is determined in step S402 that the datagram can be connected (YES in step S402), and the MSS changes (YES in step S403), the protocol stack cannot use the calculated payload sum to calculate the Internet checksum. In this case, the protocol stack notifies the sequencer 103 of substitutional performance (steps S406 and S407). That is, the protocol stack requests the sequencer 103 to substitutionally perform the calculation transfer instruction and causes the sequencer 103 to calculate the Internet checksum using the second checksum calculation unit 113. In step S408 after step S406 or S407, the protocol stack waits for a notification of calculation transfer completion from the DMA transfer unit 110 to the calculation transfer instruction from the sequencer 103. Here, the protocol stack can detect the calculation transfer completion by an interrupt or polling.

(Operation of DMA Transfer Unit 110)

Figure 5:
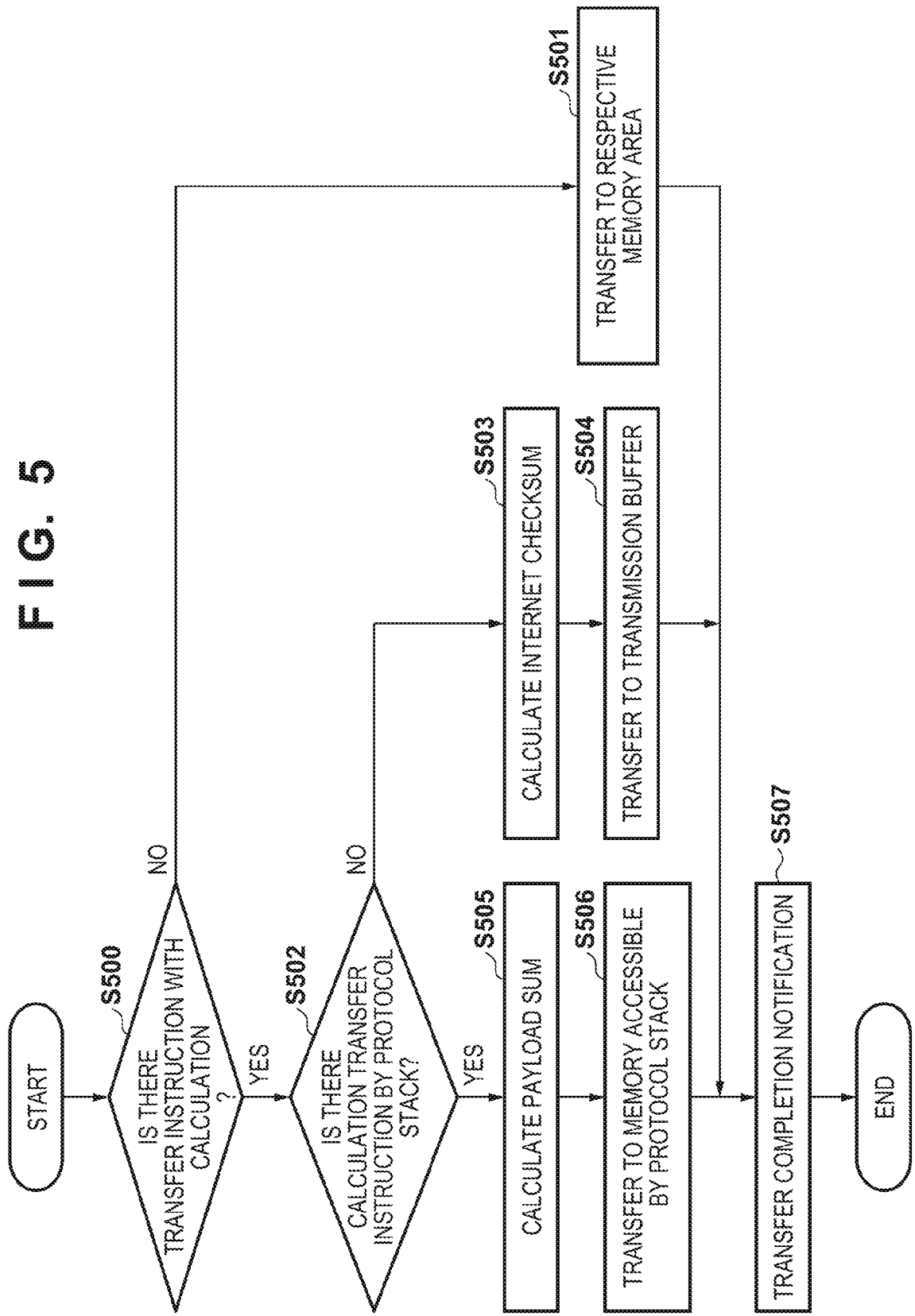
FIG. 5 is a flowchart of processing of a DMA transfer unit 110 according to the first embodiment.

FIG. 5 is a flowchart of processing of the DMA transfer unit 110 according to this embodiment. FIG. 5 is a flowchart showing processing performed in a case in which the DMA transfer unit 110 receives a calculation transfer instruction or a transfer instruction from the CPU 101 (protocol stack) or the sequencer 103.

In step S500, the DMA transfer unit 110 determines whether a received instruction is a calculation transfer instruction or a transfer instruction. For example, the DMA transfer unit 110 includes a register configured to do a bypass setting for the first checksum calculation unit 112 and the second checksum calculation unit 113 and determines, based on the value set in the register, whether the instruction is a transfer instruction or a calculation transfer instruction. Here, the DMA transfer unit 110 may determine that the instruction is a calculation transfer instruction in a case in which the difference of the transfer length is 2 bytes in the read descriptor and the write descriptor and may determine that the instruction is a transfer instruction in a case in which the transfer length is the same. In addition, when the calculation size set for the first checksum calculation unit 112 and the second checksum calculation unit 113 is 0, the DMA transfer unit 110 may determine that the instruction is a transfer instruction.

In a case of a transfer instruction (NO in step S500), the DMA transfer unit 110 performs DMA transfer between the memory areas (the memory 106, the memory 107, the internal memory 105 in the sequencer 103, and the transmission buffer 109 in the communication unit 108) based on the descriptor (step S501). On the other hand, in a case of a calculation transfer instruction (YES in step S500), in step S502, the DMA transfer unit 110 determines which one of the protocol stack and the sequencer 103 has transmitted the calculation transfer instruction (that is, the issuance source of the calculation transfer instruction). The DMA transfer unit 110 determines the issuance source of the calculation transfer instruction based on the combination of, for example, the register set value, the transaction ID on the system bus or the address of the register access source, and the transfer source and the transfer destination addresses of the descriptor. If the sequencer 103 is the issuance source of the calculation transfer instruction (NO in step S502), in step S503, the DMA transfer unit 110 calculates the Internet checksum using the second checksum calculation unit 113. Next, in step S504, the DMA transfer unit 110 transfers the communication header, the payload, and the calculated Internet checksum to the transmission buffer 109. On the other hand, if the protocol stack is the issuance source of the calculation transfer instruction (YES in step S502), in step S505, the DMA transfer unit 110 calculates the payload sum using the first checksum calculation unit 112. Next, in step S506, the DMA transfer unit 110 transfers the payload and the payload sum to the memory 107 used by the protocol stack. In step S507, the DMA transfer unit 110 notifies the issuance source of the transfer instruction or the calculation transfer instruction of transfer completion or calculation transfer completion.

(Sequence Chart of Each Processing Block (in Case in which Payload Length Change is Absent))

Figure 6:
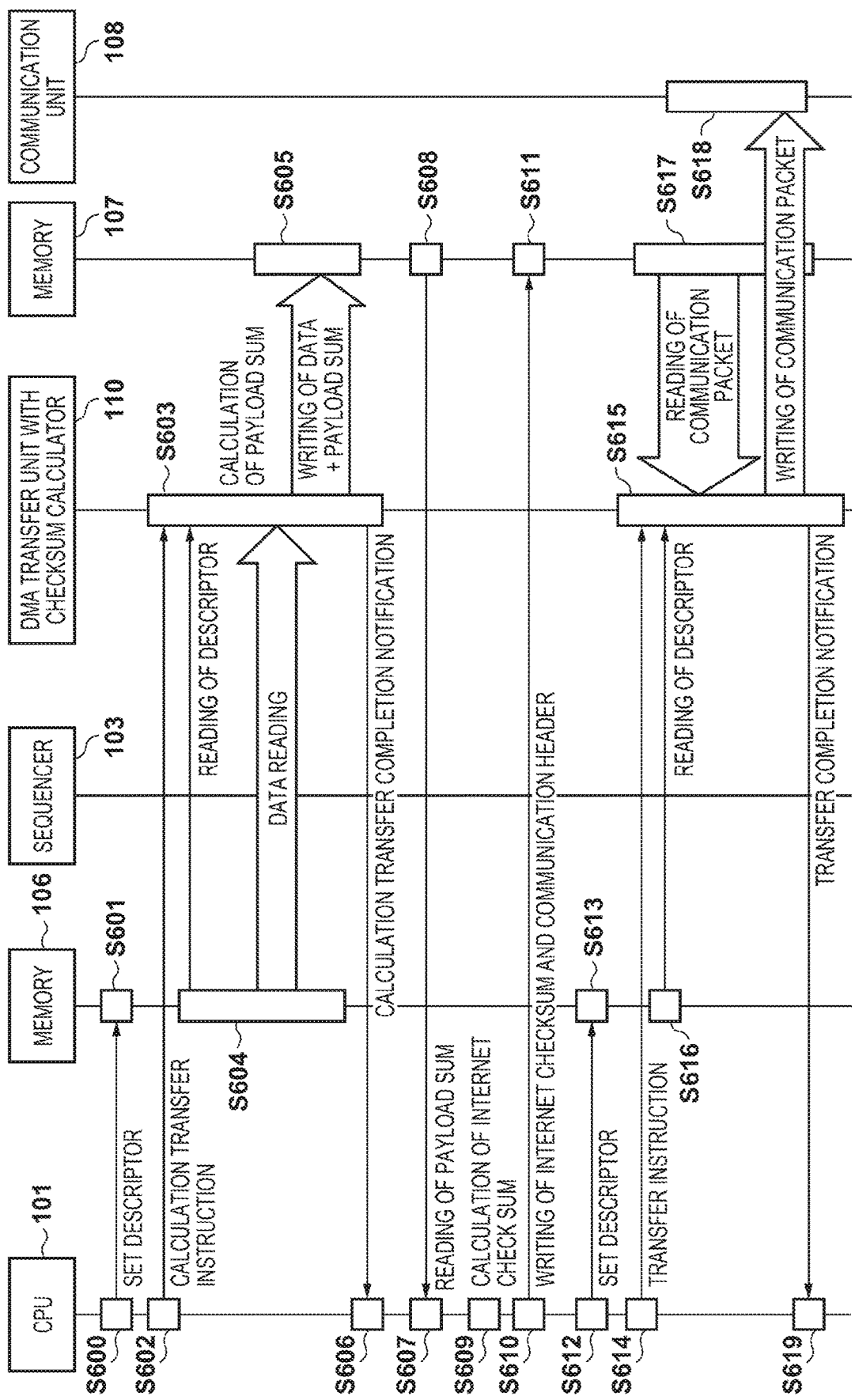
FIG. 6 is a sequence chart of each processing block in a case in which a payload length change is absent according to the first embodiment.

FIG. 6 shows a sequence chart of each processing block in a case in which a payload length change is absent. In step S600, the protocol stack operating in the CPU 101 generates a descriptor used to transfer data from the application. In step S601, the CPU 101 stores the generated descriptor in the memory 106. In step S602, the protocol stack operating in the CPU 101 issues a calculation transfer instruction to the DMA transfer unit 110. In step S603, the DMA transfer unit 110 receives the calculation transfer instruction. In step S604, the DMA transfer unit 110 reads out the descriptor from the memory 106. Next, the DMA transfer unit 110 analyzes the readout descriptor and reads out data from an address of the memory 106 matching the transfer source address. Subsequently, the first checksum calculation unit 112 of the DMA transfer unit 110 calculates a payload sum using the readout data. When the calculation of the payload sum ends, in step S605, the DMA transfer unit 110 writes, in the memory 107, the data and the payload sum at an address matching the transfer destination address in the descriptor. When data transfer is completed, in step S606, the DMA transfer unit 110 notifies the CPU 101 of calculation transfer completion to the calculation transfer instruction.

In step S607, the protocol stack confirms that the payload length does not change. That is, the protocol stack determines that the payload sum can be used to calculate the Internet checksum, and in steps S607 and S608, reads out the payload sum from the memory 107. In step S609, the protocol stack calculates the Internet checksum from the readout payload sum by referring to each field value on the communication header. Next, the protocol stack inserts the calculated Internet checksum in the checksum field of the communication header in step S610, and write the communication packet in the memory 107 in step S611. Additionally, in step S612, the protocol stack generates a descriptor used to transfer the communication packet to the transmission buffer 109 of the communication unit 108 and stores the descriptor in the memory 106. After the generation of the descriptor, in step S614, the protocol stack issues a transfer instruction to the DMA transfer unit 110. Upon receiving the transfer instruction in step S615, the DMA transfer unit 110 reads out the descriptor from the memory 106 in step S616. Next, the DMA transfer unit 110 reads out the communication packet from the memory 107 in accordance with the descriptor in step S617, and writes the communication packet in the transmission buffer 109 of the communication unit 108 in step S618. Finally, in step S619, the DMA transfer unit 110 notifies the CPU 101 (protocol stack) of transfer completion.

(Sequence Chart of Each Processing Block (in Case in which Payload Length Change is Present))

Figure 7:
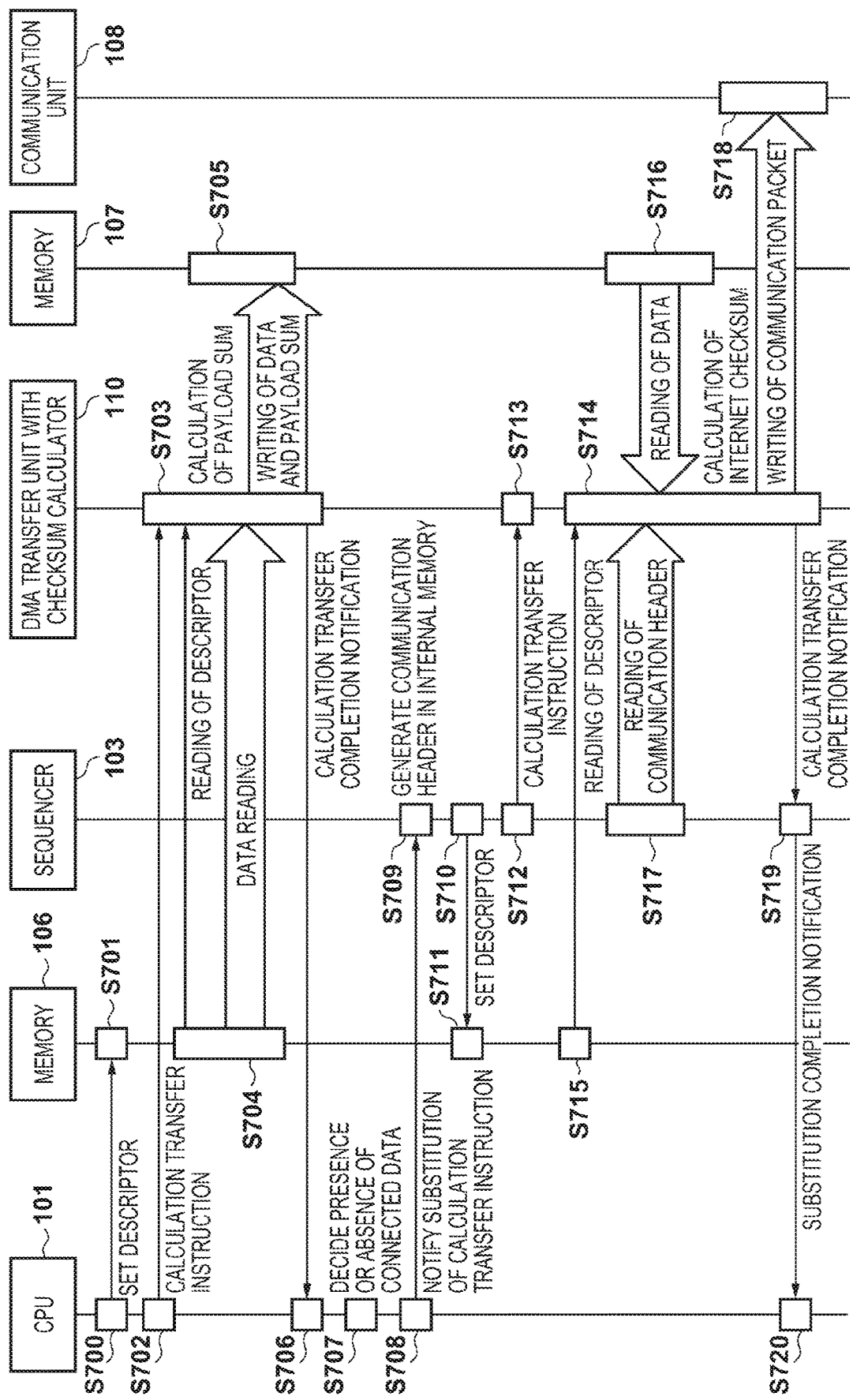
FIG. 7 is a sequence chart of each processing block in a case in which a payload length change is present according to the first embodiment.

FIG. 7 shows a sequence chart of each processing block in a case in which a payload length change is present. The processing sequence in steps S700 to S706 is the same as in steps S600 to S606 in FIG. 6, and a description thereof will be omitted. That is, in steps S700 to S706, the payload sum is calculated by the first checksum calculation unit 112.

In step S707, the protocol stack determines whether a plurality of datagrams from the application can be connected. If the plurality of datagrams can be connected, in step S708, the protocol stack notifies the sequencer 103 of a request to substitutionally perform a calculation transfer instruction and a data connection instruction. In step S709, the sequencer 103 receives the calculation substitutional performance notification including the data connection instruction and generates a communication header in the internal memory 105. Next, in step S710, the sequencer 103 generates a descriptor used for DMA transfer while calculating the Internet checksum from the generated communication header and the payload stored in the memory 107 in step S705. In step S711, the sequencer 103 stores the generated descriptor in the memory 106.

In step S712, the sequencer 103 issues a calculation transfer instruction to the DMA transfer unit 110. In step S713, by the calculation transfer instruction, the DMA transfer unit 110 is notified of the address of the descriptor stored in the memory 106 and instructed to do checksum calculation and start DMA transfer. The DMA transfer unit 110 accesses the memory 106 in step S714, and reads out the descriptor from the memory 106 in step S715. In step S715, the DMA transfer unit 110 starts DMA transfer in accordance with the readout descriptor. The DMA transfer unit 110 reads out the communication header stored in the internal memory 105 in the sequencer 103 in step S717, and reads out the data stored in the memory 107 in step S716. The DMA transfer unit 110 calculates the Internet checksum from the readout communication header and data.

In step S718, the DMA transfer unit 110 writes, as a communication packet, the communication header, the data (payload), and the Internet checksum in the transmission buffer 109 of the communication unit 108. At this time, the DMA transfer unit 110 may write the Internet checksum in the transmission buffer 109 after inserting it into the checksum field of the communication header. Alternatively, the DMA transfer unit 110 may overwrite the Internet checksum in the checksum field after the communication header is written on the transmission buffer 109.

After the completion of the write processing in step S718, the DMA transfer unit 110 notifies the sequencer 103 of calculation transfer completion, and the sequencer 103 receives the notification in step S719. Upon receiving the notification of the calculation transfer completion, the sequencer 103 notifies the CPU 101 of the completion of substitutional performance of the calculation transfer instruction. Finally, in step S720, the CPU 101 receives the notification of the completion of substitutional performance of the calculation transfer instruction.

As described above, according to this embodiment, even if the payload length is changed, the hardware can substitutionally calculate the Internet checksum, and lowering of the communication speed during DMA transfer can be prevented.

Second Embodiment

In the first embodiment, substitutionally performing Internet checksum calculation by the sequencer 103 on behalf of the CPU 101 in a case in which the payload length is changed at the time of processing of the protocol stack has been described. In the second embodiment, in addition to the case in which the payload length is changed at the time of processing of the protocol stack, a case in which the payload length can also be changed at the time of communication packet retransmission will be described. Points different from the first embodiment will be described below.

(Operation of CPU 101)

Figure 8:
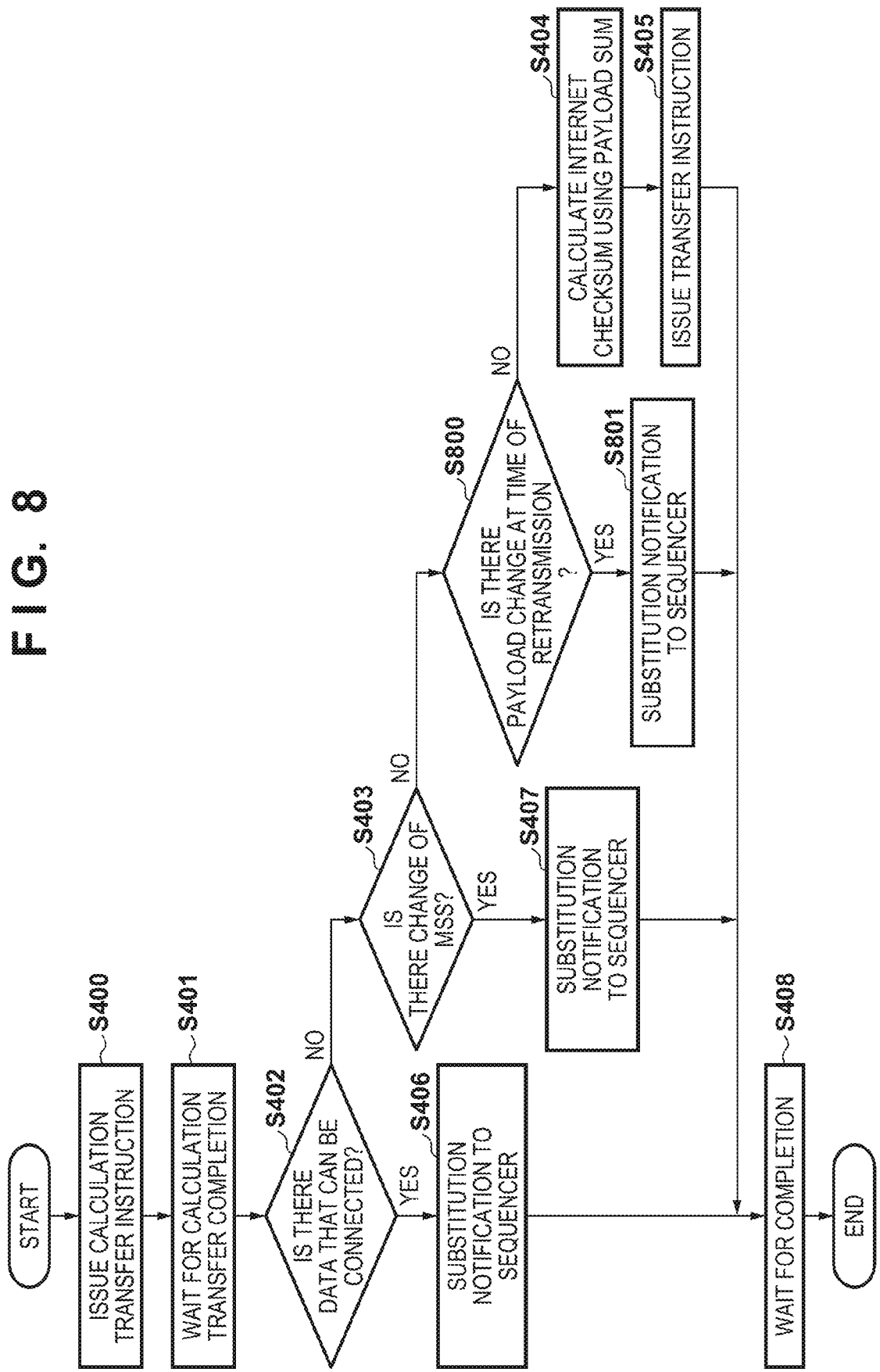
FIG. 8 is a flowchart of processing of a CPU 101 according to the second embodiment.

FIG. 8 is a flowchart of processing of a CPU 101 (protocol stack) according to this embodiment. In step S800, the protocol stack determines whether a payload change at the time of communication packet retransmission after communication packet transmission exists. A case in which a payload change occurs is a case in which data is correctly received up to the middle of the payload in transmission, and a retransmission packet (a communication packet including part of the communication packet transmitted first) is generated from the middle of the payload in transmission. In this case, since the payload is changed, the payload sum calculated at the time of transmission cannot be used. Here, to which point the communication packet is correctly received at the time of transmission occurrence can be confirmed by, for example, analyzing the ACK number of the acknowledgment packet from the transmission destination.

If a payload change exists in step S800 (YES in step S800), the process advances to step S801. In step S801, the protocol stack notifies a sequencer 103 of the substitutional performance of the calculation transfer instruction and causes a second checksum calculation unit 113 in a DMA transfer unit 110 to calculate the Internet checksum. On the other hand, when transmitting a communication packet including the same payload as that in the transmission (NO in step S800), since the payload sum can be reused, the protocol stack calculates the Internet checksum using the payload sum in step S404. Next, in step S405, the protocol stack issues a transfer instruction to perform a DMA transfer of the communication packet to a transmission buffer 109.

(Sequence Chart of Each Processing Block (in Case in which Payload Length Change is Present))

Figure 9:
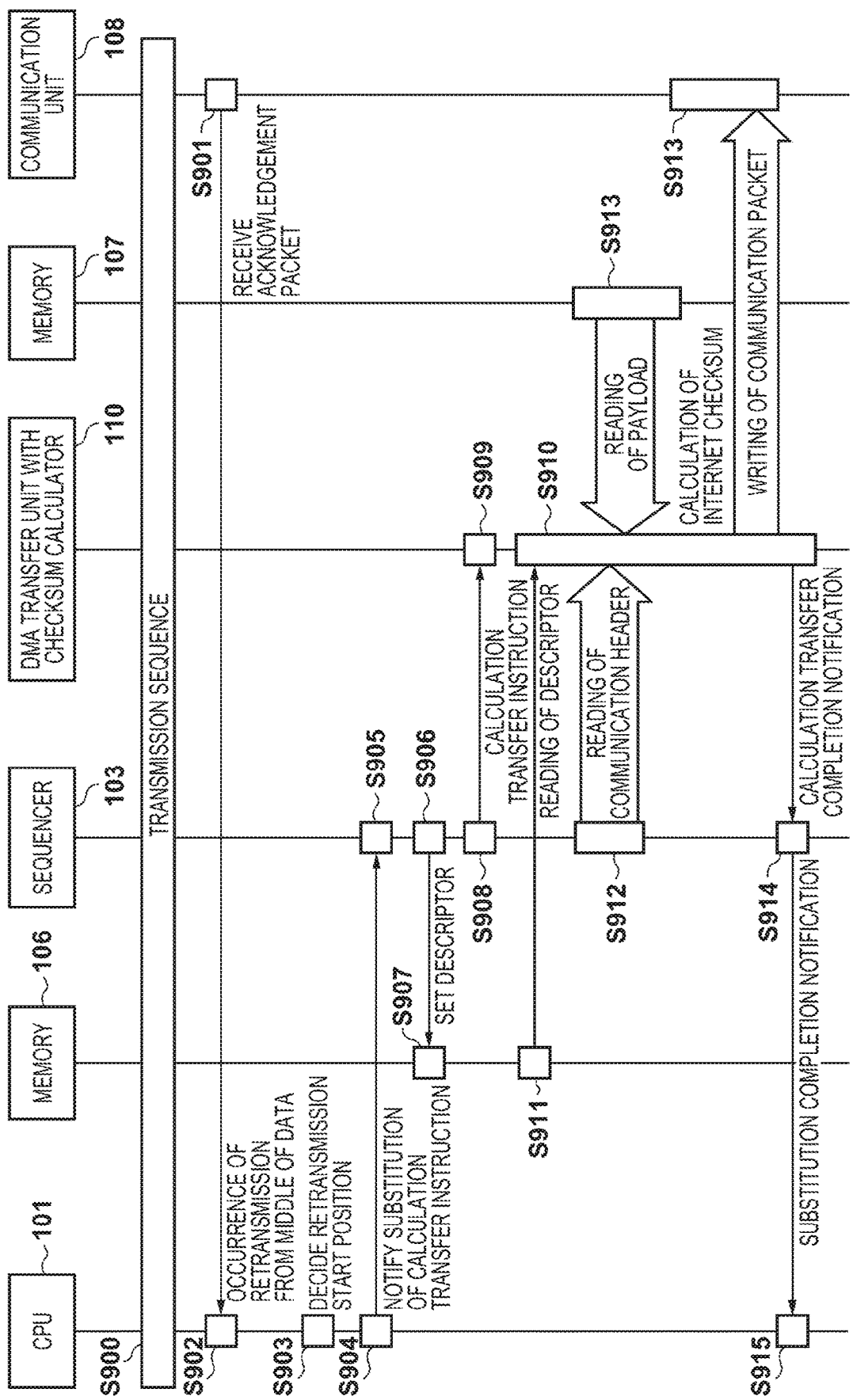
FIG. 9 is a sequence chart of each processing block in a case in which a payload change is present according to the second embodiment.

FIG. 9 shows a sequence chart of each processing block in a case in which a payload length change is present. Step S900 is a communication packet transmission sequence shown in FIGS. 6 and 7 described in the first embodiment. After the communication sequence, in step S901, a communication unit 108 receives an acknowledgement packet to the transmission packet. In step S902, the protocol stack operating in the CPU 101 analyzes the acknowledgement packet received by the communication unit 108. The protocol stack detects that the communication partner cannot correctly receive data from the middle of the data included in the transmission packet and decides to perform retransmission in which a payload change occurs. Next, in step S903, the protocol stack decides the data start position for retransmission based on the ACK number of the acknowledgement packet. After the data start position for retransmission is decided, in step S904, the protocol stack requests the sequencer 103 to substitutionally perform the calculation transfer instruction. At this time, the protocol stack notifies the sequencer 103 of the start position of the data that cannot correctly be received by the communication partner. In step S905, the sequencer 103 receives the calculation substitutional performance notification and generates a communication header in an internal memory 105. Next, in step S906, the sequencer 103 generates a descriptor used for DMA transfer while calculating the Internet checksum from the generated communication header and the payload stored in a memory 107. In step S907, the sequencer 103 stores the generated descriptor in a memory 106. Here, as the transfer source address in the descriptor, an address in the memory 106 matching the data start position notified by the CPU 101 is described. After storing the descriptor, in step S908, the sequencer 103 issues a calculation transfer instruction to the DMA transfer unit 110.

In step S908, the DMA transfer unit 110 receives the calculation transfer instruction. The DMA transfer unit 110 accesses the memory 106 in step S910, and reads out the descriptor from the memory 106 in step S911. In step S912, the DMA transfer unit 110 starts DMA transfer in accordance with the readout descriptor. The DMA transfer unit 110 reads out the communication header stored in the internal memory 105 of the sequencer 103 in step S912, and reads out the payload to the memory 107 in step S913. Here, the address to start the read of the payload designated by the descriptor is the start address of the middle data that cannot correctly be received. The second checksum calculation unit 113 of the DMA transfer unit 110 calculates the Internet checksum from the readout communication header and data in accordance with the register setting at the time of issuance of the calculation transfer instruction.

In step S913, the DMA transfer unit 110 writes, as a communication packet, the communication header, the data (payload), and the Internet checksum in the transmission buffer 109 of the communication unit 108. After the completion of the write processing in step S913, the DMA transfer unit 110 notifies the sequencer 103 of the completion of the calculation transfer instruction, and the sequencer 103 receives the notification in step S914. Upon receiving the notification of the calculation transfer instruction, the sequencer 103 notifies the CPU 101 of the completion of substitutional performance of the calculation transfer instruction. Finally, in step S915, the CPU 101 receives the notification of the completion of substitutional performance of the calculation transfer instruction.

As described above, in this embodiment, when the payload changes in retransmission, it is possible for the DMA transfer unit 110 to calculate an Internet checksum and generate a retransmission packet, thereby preventing the communication speed from lowering during DMA transfer. Note that in place of the DMA transfer unit 110, the protocol stack may calculate the Internet checksum and generate the retransmission packet.

Third Embodiment

In the first embodiment, the description has been made assuming that the payload sum is calculated when data is DMA-transferred from the memory 106 to the memory 107. However, in the UDP protocol without retransmission, a DMA transfer unit 110 may calculate an Internet checksum using a second checksum calculation unit 113 and generate a communication packet when performing DMA transfer from a memory 106 to a transmission buffer 109. Additionally, in the TCP protocol, when data management for retransmission can be performed in the memory 106 by managing the memory area between the application and the protocol stack, a communication packet may be generated without transferring (copying) to a memory 107. In addition, depending on whether the application is of a type that needs data transfer or not, whether to generate a communication packet in the transmission buffer 109 (first embodiment) or generate a communication packet without data copy to the memory 107, as described above, may be switched.

Fourth Embodiment

In this embodiment, in a communication apparatus capable of generating and transmitting a packet, a payload sum is calculated when transferring data to a transmission buffer and, at the time of packet generation, it is determined whether the payload sum calculated in advance can be used.

More specifically, in this embodiment, when transferring data from an application to the transmission buffer, the communication apparatus speculatively calculates the payload sum of the data to be transmitted, adds the calculated payload sum to the corresponding data, and stores it in the transmission buffer. Additionally, in this embodiment, when generating a header to be added to each of a plurality of packets generated from the data to be transmitted, which is read out from the transmission buffer, the communication apparatus determines whether the speculatively calculate payload sum can be used in the header to be added to each packet. According to the result of determining whether the payload calculated in advance is usable or not, the communication apparatus variably decides the data length to be processed in the generation of the plurality of packets. For example, the communication apparatus decides the data length to be processed in the generation of the plurality of packets so data that needs recalculation of the payload sum and data that does not need recalculation do not coexist.

Since this reduces unnecessary recalculation of a payload sum, it is possible to reduce a load in the calculation of the payload sum of data to be transmitted and more efficiently generate a packet.

Here, the pre-calculation of the payload sum can be executed at the same time as the transfer of user data from the application to the transmission buffer. In addition, the processing of generating a plurality of packets from user data in the transmission buffer can be offloaded using, for example, TSO (TCP Segmentation Offload) technology.

The header added to transmission data at the time of packet generation can include a TCP header, an IP header, and an Ether (Ethernet®) header.

<Hardware and Functional Arrangement of Embodiment>

Figure 10:
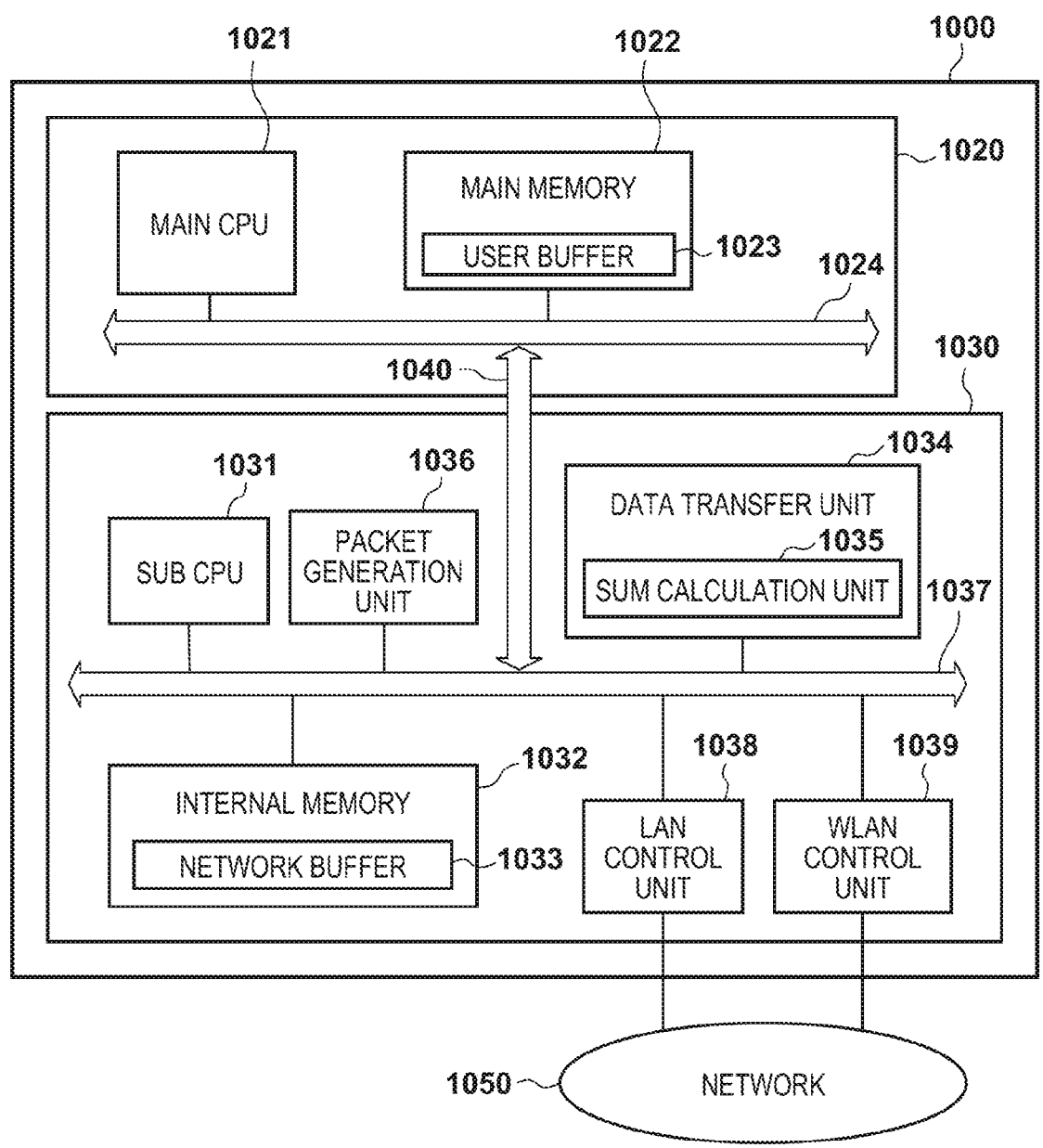
FIG. 10 is a block diagram showing an example of the hardware and the functional arrangement of a communication apparatus 1000 according to the fourth embodiment.

FIG. 10 is a block diagram showing an example of the hardware arrangement and the functional arrangement of a communication apparatus according to this embodiment.

As for functions implemented by software in the functional modules of a communication apparatus 1000 shown in FIG. 10, a program configured to provide the function of each functional module is stored in a memory such as a ROM, loaded onto a RAM, and executed by a CPU, thereby implementing the function. As for functions implemented by hardware, for example, a predetermined compiler is used to automatically generate a dedicated circuit from a program configured to implement the function of each functional module onto an FPGA. FPGA is an abbreviation for Field Programmable Gate Array. Alternatively, a Gate Array circuit may be formed, like FPGA, and implemented as hardware. Otherwise, each function may be implemented by an ASIC (Application Specific Integrated Circuit). Note that the arrangement of each functional block shown in FIG. 10 is merely an example. A plurality of functional blocks may form one functional block, or a functional block may be divided into blocks for performing a plurality of functions.

The communication apparatus 1000 includes a main processing unit 1020 and a communication processing unit 1030. The main processing unit 1020 executes the processing of the entire communication apparatus 1000 including various kinds of applications. The communication processing unit 1030 executes various kinds of communication processing and control including, for example, communication protocol processing such as TCP/IP. The main processing unit 1020 and the communication processing unit 1030 are connected to each other by a bus bridge 1040.

The main processing unit 1020 includes a main CPU 1021, a main memory 1022, and a main bus 1024.

The main CPU 1021 executes various kinds of programs and controls the entire communication apparatus 1000. Programs executed by the main CPU 1021 include an OS (Operating System) and various kinds of applications.

The main memory 1022 stores data and programs needed when the main CPU 1021 or a sub CPU 1031 of the communication processing unit 1030 executes each process. The main memory 1022 may be formed by, for example, a semiconductor memory such as a DRAM (Dynamic Random Access Memory).

In the main memory 1022, a user buffer 1023 is formed by the main CPU 1021, and user data is stored in the user buffer 1023. The user buffer 1023 is an area accessible not only from the main CPU 1021 but also from the sub CPU 1031 via the bus bridge 1040 and the main bus 1024. The user data stored in the user buffer 1023 includes data that the main CPU 1021 wants to send from an application of the communication apparatus 1000 to a counterparty communication apparatus via a network 1050. The user data will simply be referred to as "data" hereinafter.

The main bus 1024 is used for access and data transfer from the main CPU 1021 to the main memory 1022 and the communication processing unit 1030, access and data transfer from the communication processing unit 1030 to the main memory 1022, and the like.

The communication processing unit 1030 includes the sub CPU 1031, an internal memory 1032, a data transfer unit 1034, a packet generation unit 1036, a local bus 1037, a LAN control unit 1038, and a WLAN control unit 1039.

The sub CPU 1031 executes programs concerning various kinds of communication processing. The programs executed by the sub CPU 1031 include an OS and a communication protocol stack for communication protocol processing. In this embodiment, an example in which a TCP/IP protocol stack is executed as communication protocol processing will be described. However, this may be another protocol stack.

The internal memory 1032 may be an on-chip memory formed on a NIC (Network Interface Card). The internal memory 1032 is a memory accessible from the sub CPU 1031, the data transfer unit 1034, and the packet generation unit 1036 of the communication processing unit 1030. The internal memory 1032 can be formed by, for example, a semiconductor memory such as an SRAM (Static Random Access Memory) and can thus be accessed from the main memory 1022 at a high speed.

In the internal memory 1032, a network buffer 1033 is formed by the sub CPU 1031. The network buffer 1033 is a transmission buffer used to process data transmitted/received between the sub CPU 1031 and the counterparty communication apparatus. Details of the network buffer 1033 will be described later with reference to FIG. 11.

The data transfer unit 1034 can execute data transfer in accordance with an instruction from the main CPU 1021, the sub CPU 1031, or the packet generation unit 1036. The data transfer unit 1034 transfers, for example, data stored in the main memory 1022 to the packet generation unit 1036 or the internal memory 1032.

The data transfer unit 1034 includes a sum calculation unit 1035. The sum calculation unit 1035 can monitor and read, for example, data transferred by the data transfer unit 1034 from the user buffer 1023 to the network buffer 1033, thereby calculating a sum for the data to be transferred.

The sum calculation result can be used as a payload sum. That is, in packet generation processing, an Internet checksum is calculated by adding the sum calculation result of the data row of a header to a payload sum.

The payload sum calculated by the sum calculation unit 1035 is added to the end of the data transferred to the network buffer 1033, thus associated with the data, and stored on the network buffer 1033 of the internal memory 1032. For example, when the sub CPU 1031 instructs the data transfer unit 1034 to transfer data, the payload sum calculated in correspondence with the data can be read out from a memory area immediately after the data is stored in the network buffer 1033.

Some or all of processes executed by the data transfer unit 1034 can be implemented on a DMAC (Direct Memory Access Controller) and offloaded. More specifically, the DMAC divides user data transferred from the application by the send( ) call of a socket API into a size equal to or smaller than an MSS (Maximum Segment Size) and transfers the data to the network buffer 1033. The DMAC also calculates a payload sum for the data transferred to the network buffer 1033. The MSS is the maximum value of the transmission unit (segment) of user data, which is set at the time of establishment of a communication session such as a TCP session, that is, the maximum segment size transmittable by the TCP session. Normally, the MSS is notified by a TCP option as the maximum value of the segment that the apparatus can receive from the counterparty communication apparatus.

When the processing of the data transfer unit 1034 is implemented in the DMAC, the processing load on the sub CPU 1031 concerning execution of TCP/IP protocol processing can be reduced, and the TCP/IP protocol processing can be sped up.

The data transfer unit 1034 incorporates a register capable of setting data transfer and can set a data transfer source address, a data transfer destination address, and a data transfer length from the sub CPU 1031 and the packet generation unit 1036. When executing sum calculation at the same time as transfer, the range of a data row to be subjected to the sum calculation is designated in the register by the sub CPU 1031.

Note that a form in which various kinds of transfer setting information are arranged on a memory such as the internal memory 1032, and a memory address at which transfer setting information is arranged is designated in the register of the data transfer unit 1034 may be employed. The data transfer unit 1034 can read out the transfer setting information from the designated memory address and execute data transfer.

Here, if the packet generation unit 1036 can generate a packet without changing the size from the size divided when the data transfer unit 1034 transfers user data to the network buffer 1033, the payload sum of the data portion need not be recalculated in packet generation. In this case, the packet generation unit 1036 can calculate the Internet checksum to be stored in the TCP header using the payload sum speculatively calculated by the sum calculation unit 1035 of the data transfer unit 1034.

On the other hand, if the payload sum speculatively calculated by the sum calculation unit 1035 cannot be used, the packet generation unit 1036 needs to recalculate the checksum by calculating the sum of the data rows of data at the time of packet generation. This increases the processing load and impedes speedup.

The packet generation unit 1036 packetizes user data stored in the network buffer 1033 by connecting or dividing the user data in accordance with an instruction from the sub CPU 1031. More specifically, the packet generation unit 1036 generates a plurality of headers for a plurality of packets based on the header information of TCP/IP corresponding to top data in the network buffer 1033, which is input from the sub CPU 1031.

In this embodiment, the packet generation unit 1036 can change the execution size based on whether the payload sum speculatively calculated by the sum calculation unit 1035 is usable or not. The execution size means a processing data length (user data length) to be processed in generating a plurality of packets.

The plurality of headers generated by the packet generation unit 1036 may be stored in the internal memory of the packet generation unit 1036 or may be stored in the internal memory 1032. As described above, when generating the headers, the payload sum calculated in advance by the sum calculation unit 1035 can be used. The packet generation unit 1036 generates the plurality of packets to be transmitted to the network by, for example, connecting the generated headers and the transmission data (payload) on the network buffer 1033 via the sub CPU 1031.

In addition, the packet generation unit 1036 causes the data transfer unit 1034 to execute processes that need data movement such as write of headers ad read of user data necessary for packet generation processing. That is, the packet generation unit 1036 can generate transfer setting information of the data transfer unit 1034 and causes it to execute data transfer.

Some or all of processes executed by the packet generation unit 1036 can be implemented on the offloader of TSO (TCP Segmentation Offload) and offloaded. The TSO can be implemented as a hardware offloader on, for example, a NIC.

More specifically, the TSO offloader divides the user data stored in the network buffer 1033 into a plurality of data segments, and generates and adds a TCP/IP header to each of the divided data segments, thereby generating a plurality of packets. The plurality of packets generated by the TSO offloader are transferred to a communication control unit such as the LAN control unit 1038 or the WLAN control unit 1039 and sent to the network 1050.

When the TSO offloader is used, in the TCP/IP protocol processing, user data of a large size can be stored in the network buffer 1033 without limiting the size to the MSS. The TSO offloader reads out the user data in the network buffer 1033 via the data transfer unit 1034 and divides the user data based on the MSS, thereby generating a plurality of packets. From the viewpoint of the TCP/IP protocol processing, the header generation and addition processing need not be executed as many times as the number of packets, resulting in speedup of the processing.

In particular, when the packet generation unit 1036 is implemented in the TSO offloader that generates the plurality of packets at once from the user data of the long payload length, the recalculation of the payload sum may deliberately increase. This is because the TSO offloader cannot generate the plurality of packets by simultaneously performing, in one TSO processing, header generation using the payload sum calculated in advance and header generation without using the payload sum calculated in advance. That is, in the plural packet generation, if the header generation is executed using the payload sum calculated in advance, the payload sum calculated in advance needs to be usable for all the payloads of the plurality of packets to be generated. In other words, when generating the packets, it is impossible to recalculate the payload sum for only some of the payloads of the plurality of packets.

The local bus 1037 connects the functional blocks of the communication processing unit 1030 to each other and is connected to the main bus 1024 via the bus bridge 1040.

The LAN (Local Area Network) control unit 1038 is a wired communication interface connected to the network 1050, and executes packet transmission/reception between the communication apparatus 1000 and the counterparty communication apparatus. The LAN control unit 1038 includes the hardware circuits of the PHY layer and the MAC layer (transmission medium control) of a transmission medium. For example, if the interface of the LAN control unit 1038 is Ethernet®, the LAN control unit 1038 corresponds to an Ethernet® NIC (Network Interface Card).

The WLAN (Wireless LAN) control unit 1039 is a wireless communication interface connected to the network 1050, and executes packet transmission/reception between the communication apparatus 1000 and the counterparty communication apparatus. The WLAN control unit 1039 includes a controller that executes wireless LAN control such as IEEE 802.11a/b/g/n/ac and an RF (Radio Frequency) circuit.

<Example of Arrangement of Network Buffer 1033>

Figure 11:
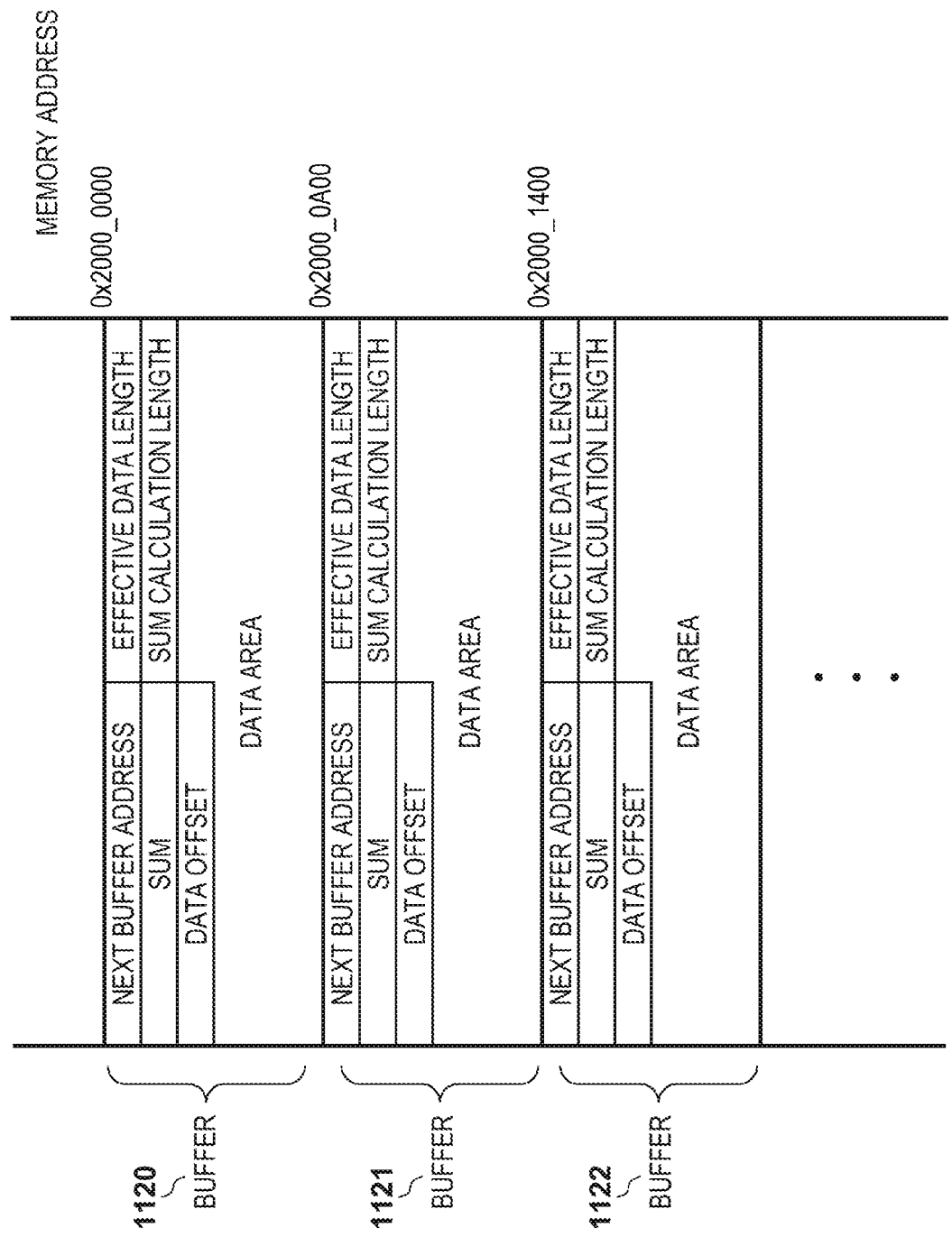
FIG. 11 is a view showing an example of the arrangement of a network buffer 1033 of the communication apparatus 1000.

FIG. 11 shows an example of the arrangement of the network buffer 1033 formed by the sub CPU 1031 in the internal memory 1032 of the communication processing unit 1030 of the communication apparatus 1000. The network buffer 1033 is formed in a predetermined area of the internal memory 1032 when activating the sub CPU 1031. Acquisition and release of the network buffer 1033 are executed in the internal memory 1032 as needed in association with packet transmission and reception processing.

As shown in FIG. 11, the network buffer 1033 has an arrangement in which a plurality of buffers 1120 to 1122 are connected. That is, when executing packet transmission, a plurality of buffers are provided in the communication apparatus 1000. Each of the plurality of buffers has, as constituent elements, a next buffer address, an effective data length, a sum, a sum calculation length, a data offset, and a data area. Note that FIG. 11 shows an example in which the buffers 1120 to 1122 are arranged in continuous areas on the internal memory 1032. However, they need not always be arranged in the continuous areas. In addition, all the buffers 1120 to 1122 shown in FIG. 11 have the same internal arrangement, and the number of buffers is not limited to the number shown in FIG. 11.

In this embodiment, all pieces of information of the constituent elements of the buffers other than the data areas are set by the sub CPU 1031, and these will also be referred to collectively as "buffer information" hereinafter. The buffer information includes a next buffer address, an effective data length, a sum, a sum calculation length, and a data offset, as shown in FIG. 11.

The next buffer address represents the address information of the next buffer connected to the buffer. For example, when the buffer connected to the buffer 1120 is the buffer 1122, the address "0x2000_1400" of the buffer 1122 on the memory is stored in the next buffer address of the buffer 1120.

The effective data length represents the length of data stored in the data area of the buffer. For example, if the stored data is a payload of MSS from the start of the data area, the MSS value is set as the value of the effective data length.

The sum represents the value of a sum calculated for the data stored in the data area. The value of a payload sum speculatively calculated by the sum calculation unit 1035 of the data transfer unit 1034 is stored in the sum.

The sum calculation length represents the data length of the data (payload) for which the payload sum is calculated. The data offset represents the offset length from the start address of the data area to the address at which the effective data length is stored. For example, if data of MSS from the start of the data area is stored, and the data offset is set, the actual effective data length that is the length of untransmitted data is a value obtained by subtracting the offset length from the MSS.

User data is stored in the data area. In this embodiment, a payload to be transmitted as a packet is stored. Write and read of the payload stored in the data area are executed by the data transfer unit 1034.

<Outline of Packet Generation Processing Using TSO Processing>

Figure 12:
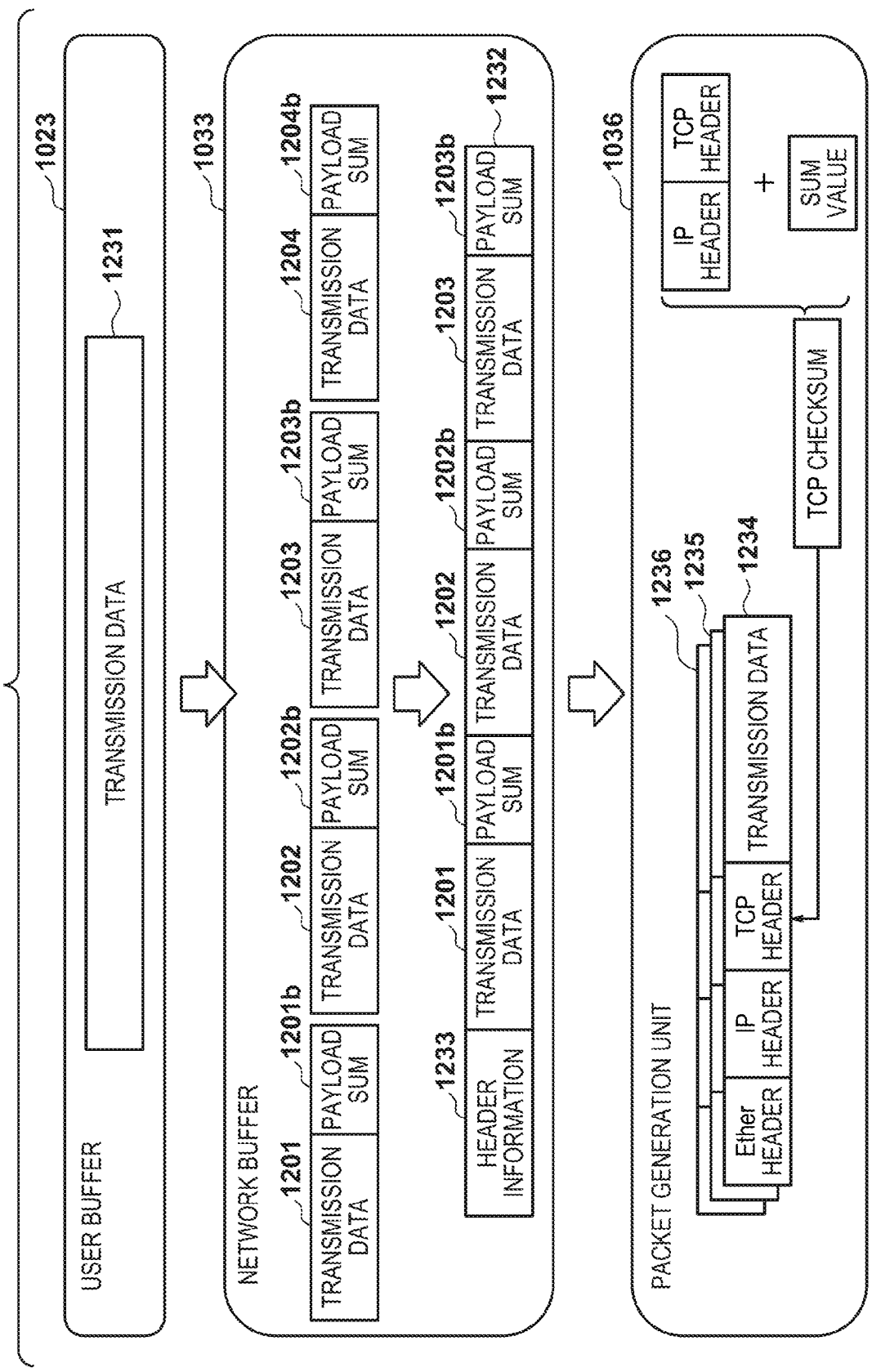
FIG. 12 is a view for explaining user data storage in the transmission buffer 1033 and an example of a data layout in TSO processing according to the embodiment.

FIG. 12 is a view for explaining the outline of data transfer from the application to the network buffer 1033 and generation processing of a plurality of packets by the TSO offloader.

As shown in FIG. 12, the data transfer unit 1034, for example, DMAC divides user data (transmission data) 1231 in the user buffer 1023 on the MSS basis and transfers the data as a plurality of transmission data 1201 to 1204 to the network buffer 1033. At the time of data transfer, the sum calculation unit 1035 of the data transfer unit 1034 calculates payload sums 1201b to 1204b for the plurality of transmission data 1201 to 1204, respectively, adds the payload sums to the calculated data, and stores them in the buffers.

Referring to FIG. 12, in the network buffer 1033, header information 1233 necessary to generate a TCP header, an IP header, and an Ether header at the time of packet generation is formed in the area of each header information shown in FIG. 12 for the plurality of transmission data 1201 to 1204.

When the packet generation unit 1036 is implemented in the TSO offloader, the packet generation unit 1036 executes TSO processing of dividing transmission data 1232 stored in the network buffer 1033 to generate a plurality of packets at once.

More specifically, the packet generation unit 1036 divides the transmission data 1232 in the network buffer 1033, adds a TCP header, an IP header, and an Ether header to each transmission data (payload), thereby generating a plurality of packets 1234, 1235, and 1236. The TCP header, the IP header, and the Ether header will be referred to as a "TCP/IP header". Internet checksums (TCP checksums) corresponding to the payloads of the transmission packets 1234, 1235, and 1236 are written in the TCP headers.

As for the Internet checksum, if the payload sums 1201b to 1204b added to the transmission data 1201 to 1204 in the network buffer 1033 are usable, a sum is calculated by reading out only the header information 1233 and added to the payload sum calculated in advance. On the other hand, if the payload sums 1201b to 1204b cannot directly be used, the Internet checksum needs to be calculated by reading out the whole transmission data 1232 in addition to the header information 1233 when generating the packet header (TCP/IP header). From the viewpoint of load reduction and throughput improvement in generating a plurality of packets, the Internet checksum recalculation that needs read of the whole transmission data 1232 should be avoided as much as possible.

The plurality of generated packets 1234, 1235, and 1236 are transmitted to the network 1050 at once.

In this way, the generation processing of the headers (the TCP header, the IP header, and the Ether header) that are generated for each packet and are to be added to the packet and the header addition processing of the payload are offloaded by hardware, thereby speeding up the generation processing of the plurality of packets.

In this embodiment, the sub CPU 1031 determines whether the payload sums 1201b to 1204b calculated by the sum calculation unit 1035 of the data transfer unit 1034 can be used. Based on whether the payload sums can be used, the sub CPU 1031 variably decides the execution size of TSO processing to be executed at once by the packet generation unit 1036 (TSO offloader) and instructs the decided execution size to the packet generation unit 1036.

Here, as described above, the TSO offloader cannot execute the TSO processing of generating the plurality of packets by simultaneously performing header generation using the payload sums calculated in advance and header generation without using the payload sums calculated in advance. For this reason, in this embodiment, upon determining that the payload sums calculated in advance for the transmission data in the network buffer 1033 can be used, the sub CPU 1031 decides the execution size of the TSO processing based on the data length of transmission data for which the payload sums can be used. On the other hand, upon determining that the payload sums calculated in advance for the transmission data in the network buffer 1033 cannot be used, the sub CPU 1031 decides the execution size of the TSO processing based on the data length of transmission data for which the payload sums cannot be used. Details of execution size decision in the TSO processing (plural packet generation processing) will be described later with reference to FIG. 15.

<Example of Packet Transmission Processing Sequence of Communication Apparatus 1000>

Figure 13:
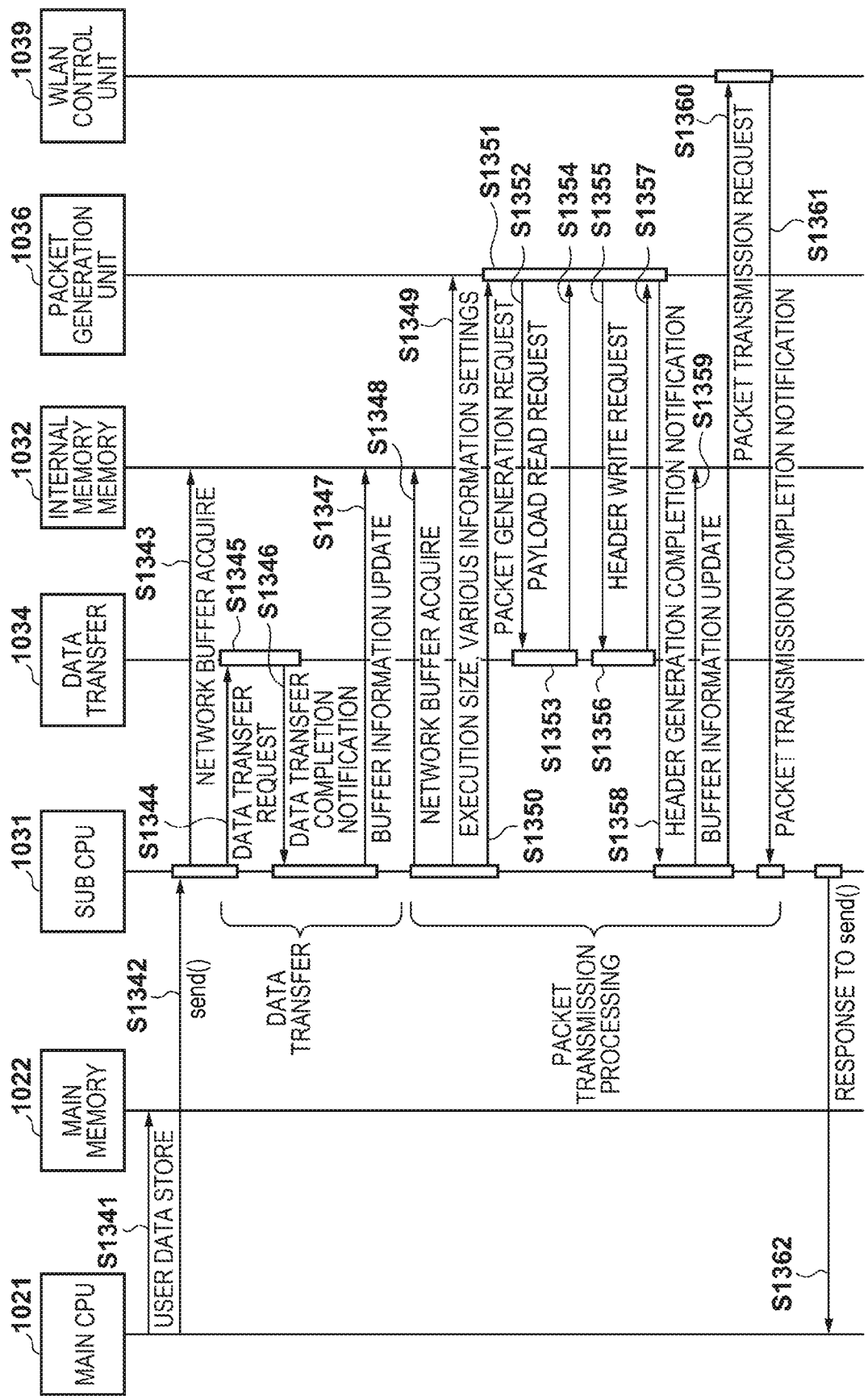
FIG. 13 is a sequence chart showing an example of the processing sequence of packet transmission from the communication apparatus 1000 to a counterparty communication apparatus.

FIG. 13 shows the sequence of packet transmission processing of transmitting a packet from the communication apparatus 1000 to the counterparty communication apparatus via the network 1050.

In step S1341, the main CPU 1021 stores user data in the user buffer 1023 of the main memory 1022.

In step S1342, the main CPU 1021 invokes send( ) that is a socket API as a user data transmission request from the application.

When invoking of send( ) is executed in step S1342, the sub CPU 1031 starts data transfer processing for packet transmission and first copies the user data from the user buffer 1023 to the network buffer 1033.

To execute the user data copy to the network buffer 1033, in step S1343, the sub CPU 1031 first acquires buffers as many as the number necessary for user data transmission from an area of the network buffer 1033 of the internal memory 1032. When acquiring a plurality of buffers, all the plurality of acquired buffers are connected by next buffer addresses in the buffer information.

In step S1344, the sub CPU 1031 requests the data transfer unit 1034 to copy (transfer) the user data from the user buffer 1023 to the acquired buffers. In addition, the sub CPU 1031 performs setting for the register in the data transfer unit 1034 so as to execute sum calculation for data to be transferred at the time of transfer.

In step S1345, the data transfer unit 1034 requested to copy the user data reads out the user data from the user buffer 1023 and divisionally stores the user data in the buffers in the network buffer 1033.

At this time, the data transfer unit 1034 divides the data to each buffer while setting the MSS as the maximum length. For example, if the size of the user data existing in the user buffer 1023 is 7,000 bytes, and the MSS is 1,460 bytes, 1,460-byte data is stored in each of four buffers, and 1,160-byte data is stored in the final buffer. Here, the user data divisionally stored in each buffer becomes the payload of a packet.

In step S1345, during the user data transfer to the network buffer 1033 by the data transfer unit 1034, the sum calculation unit 1035 speculatively calculates the payload sum of the transferred user data. The payload sum calculated here is written in, for example, a memory area immediately after the transferred user data. When the data transfer and the payload sum write in step S1345 are completed, the data transfer unit 1034 notifies the sub CPU 1031 of data transfer completion in step S1346.

Upon detecting that the data transfer requested in step S1344 is completed, in step S1347, the sub CPU 1031 updates the buffer information of each buffer to which the user data is transferred. Here, the payload sums calculated at the time of data transfer in step S1345 are stored in the sum fields of the buffers 1120 to 1122, which form the buffer information. At this time, the effective data length and the sum calculation length in the buffer information of each the buffers 1120 to 1122 match.

Next, the sub CPU 1031 starts transmission processing of the user data copied to the network buffer 1033. First, in step S1348, the sub CPU 1031 acquires the network buffer 1033 to store headers to be added to packets to be generated by the packet generation unit 1036. Note that the data area of the network buffer 1033 acquired in step S1348 to store the headers may be limited to a size smaller than the data area of the network buffer 1033 to store the user data.

In step S1349, the sub CPU 1031 decides the execution size in the plural packet generation processing (TSO processing) to be executed by the packet generation unit 1036 and notifies the packet generation unit 1036 of the execution size.

In communication by the TCP protocol, the connection changes between applications that are performing communication, and the window size and the MSS are managed for each connection. In this embodiment, the sub CPU 1031 executes the management of each connection, and connection information such as the window size and the MSS is stored in the main memory 1022. The connection information stored in the main memory 1022 may be referred to by the sub CPU 1031, the data transfer unit 1034, and the packet generation unit 1036 to decide the transmission data size.

Detailed decision processing of the execution size set in step S1349 from the sub CPU 1031 to the packet generation unit 1036 will be described later with reference to FIG. 15. In step S1349, the sub CPU 1031 reads out not only the execution size but also the information used to generate the TCP/IP header and the payload sums calculated at the time of data transfer from the buffer information and sets them in the packet generation unit 1036.

More specifically, the sub CPU 1031 generates, as information used to cause the packet generation unit 1036 to generate a TCP/IP header, a TCP/IP header for the start payload of a packet to be generated and transfers it to the packet generation unit 1036. The header generated by the sub CPU 1031 for the start payload is called a "template header".

After the pieces of information necessary for packet generation are set, the sub CPU 1031 sends a packet generation request to the packet generation unit 1036 in step S1350.

When requested to generate packets, in step S1351, the packet generation unit 1036 divides the user data stored in the network buffer 1033, generates a TCP/IP header, and generates a plurality of packets.

More specifically, for the header fields such as a transmission source, a destination IP address, a transmission destination, and a destination port number, which do not change between the plurality of packets, in the information necessary for header generation, the packet generation unit 1036 generates headers by duplicating the entire template header.

On the other hand, for the header fields such as, for example, an IP header checksum in an IPv4 header, a datagram length, a sequence number on an TCP header, and an Internet checksum, which change between the plurality of packets, the packet generation unit 1036 generates headers by changing the contents from the template header.

In this embodiment, when calculating the Internet checksum in the TCP/IP header generation of step S1351, the processing changes depending on whether the payload sum is set or not. More specifically, if the payload sum is not set, in step S1352, the packet generation unit 1036 reads out the user data stored in the network buffer 1033 and executes sum calculation for the readout user data.

The user data read from the network buffer 1033 and the sum calculation in this case are executed via the data transfer unit 1034 and the sum calculation unit 1035 in step S1353, as in the data copy to the network buffer 1033 of step S1345. The packet generation unit 1036 performs transfer setting to the register in the data transfer unit 1034 so as to execute designation of a data range to be read out and sum calculation for the data.

In step S1354, the readout user data and the calculated payload sum are supplied to the data transfer unit 1034 or the packet generation unit 1036. The packet generation unit 1036 can obtain the sum of the obtained payload, the TCP header, and the pseudo header portion and calculate the Internet checksum to be written in the TCP header.

On the other hand, if the payload sum is set in step S1351, the user data need not be read out, and the processes of steps S1352 to S1354 can be omitted. The packet generation unit 1036 can obtain the sum of the set payload sum, the TCP header, and the pseudo header portion and calculate the Internet checksum.

In step S1355, the packet generation unit 1036 instructs the data transfer unit 1034 to store the plurality of generated headers in the area of the network buffer 1033 acquired in step S1348. Calculation of the Internet checksum is executed at the same time as the transfer. The packet generation unit 1036 performs transfer setting for executing header transfer, sum calculation for each header row, and addition of payload sums to the register in the data transfer unit 1034. The checksum field in the TCP header of the transfer source is generated without calculation (0 value), and the checksum field is overwritten by the Internet checksum calculated at the time of transfer.

In step S1356, the data transfer unit 1034 stores the plurality of headers, whose storage is instructed in step S1355, in the network buffer 1033. When the plurality of generated headers are stored in the network buffer 1033, in step S1357, the data transfer unit 1034 notifies the packet generation unit 1036 of the completion of storage of the plurality of generated headers in the network buffer 1033.

In step S1358, the packet generation unit 1036 notifies the sub CPU 1031 that the generation of the plurality of headers is completed.

Upon detecting that the generation of the plurality of headers is completed, in step S1359, the sub CPU 1031 updates the buffer information to generate a packet by connecting each generated header and a payload. More specifically, it is possible for the sub CPU 1031 to set an address at which a payload is stored to the next buffer address of the network buffer 1033 in which the headers are stored, thereby forming one packet. The same processing as described above is executed repetitively as many times as the number of packets. Accordingly, a plurality of packets are generated.

When the generation of the plurality of packets is completed in step S1359, the sub CPU 1031 makes an instruction requesting the WLAN control unit 1039 to transmit the plurality of packets that are connected. The WLAN control unit 1039 instructed to transmit the plurality of packets reads out the plurality of packets (packet group) stored in the network buffer 1033 and transmits them to the network 1050.

When transmission of all packets is completed, in step S1361, the WLAN control unit 1039 notifies the sub CPU 1031 of the completion of the packet transmission. Note that an example in which the WLAN control unit 1039 transmits the packets has been described above. Instead, the LAN control unit 1038 may similarly transmit the packets.

The above-described processes of steps S1348 to S1361 correspond to the series of processes of generating and transmitting a plurality of packets. The processes of steps S1348 to S1361 are repeated until all the user data copied to the network buffer 1033 are transmitted.

When all the user data copied to the network buffer 1033 are transmitted as packets, in step S1362, the sub CPU 1031 notifies the main CPU 1021 of a response representing that the send( ) call has succeeded.

<Packet Transmission Processing of Communication Apparatus 1000>

Figure 14:
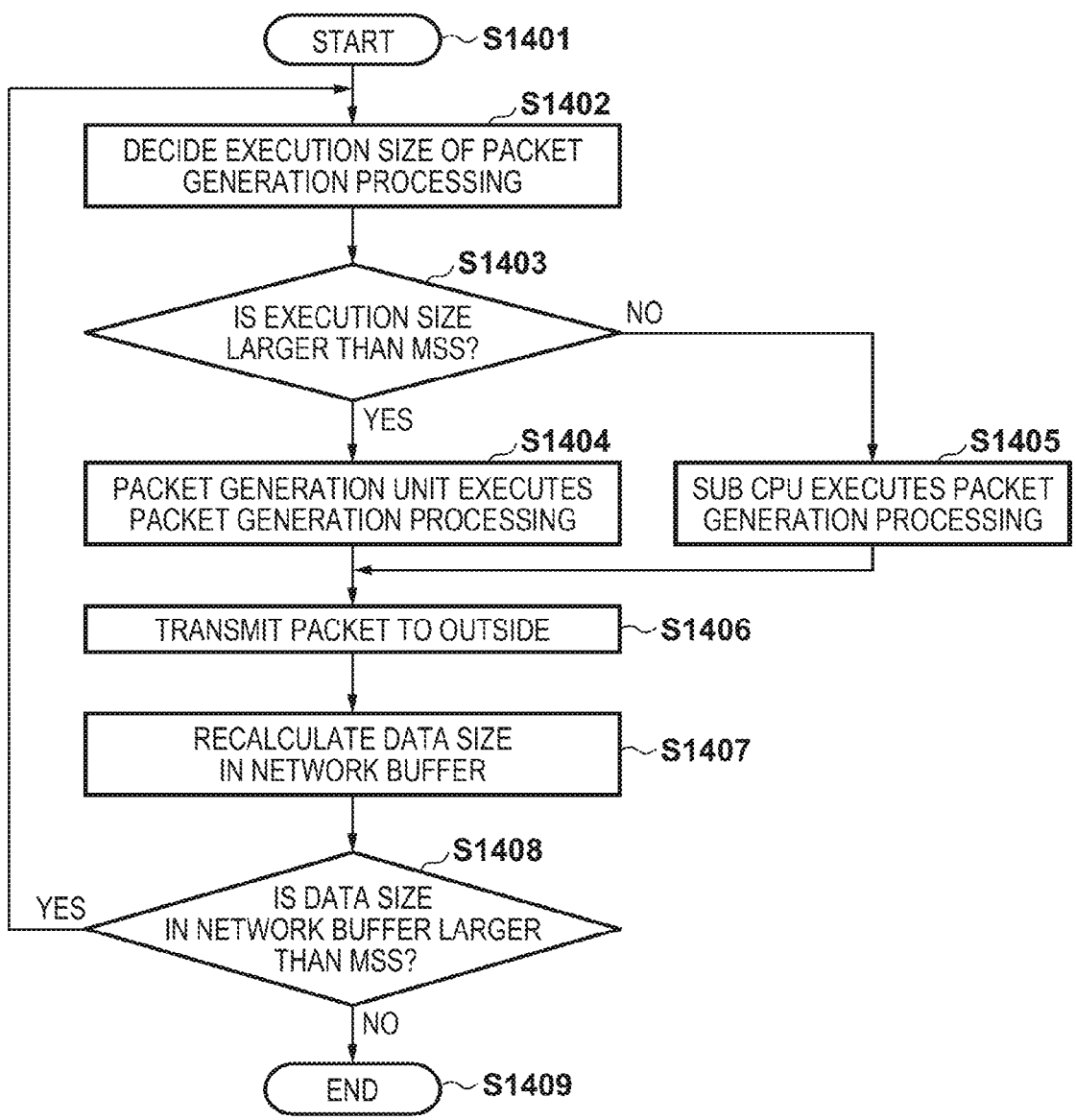
FIG. 14 is a flowchart showing an example of the processing procedure of packet generation processing of the communication apparatus 1000.

FIG. 14 is a flowchart showing an example of the processing procedure of packet transmission processing executed by the communication apparatus 1000 in this embodiment. The processing shown in FIG. 14 corresponds to the processes of steps S1349 to S1361 shown in FIG. 13. The packet transmission processing shown in FIG. 14 may be activated when, for example, instructed to transmit user data by the application. However, the present invention is not limited to this.

After the data transfer unit 1034 copies the user data to the network buffer 1033 (step S1345 in FIG. 13), and the sub CPU 1031 ensures the network buffer as the header output area for the packet generation unit 1036 (step S1348), the communication processing unit 1030 starts packet transmission processing in step S1401.

In step S1402, the sub CPU 1031 decides the execution size of plural packet generation processing to be executed by the packet generation unit 1036 and sets the decided execution size in the packet generation unit 1036. The execution size decision method will be described later with reference to FIG. 15.

In step S1403, the sub CPU 1031 determines whether the execution size of the plural packet processing decided in step S1402 is larger than the MSS of connection used for packet transmission. The MSS can be acquired by referring to connection information stored in the main memory 1022.

If the execution size decided in step S1402 is larger than the MSS (YES in step S1403), the process advances to step S1404, and the packet generation unit 1036 executes the plural packet generation processing. On the other hand, if the execution size decided in step S1402 is equal to or smaller than the MSS (NO in step S1403), the process advances to step S1405, and the sub CPU 1031 may execute the packet generation processing.

If the packet size is smaller than the MSS in step S1403, only one transmission packet is generated. Hence, the packet need not be generated using the packet generation unit 1036. Considering overhead caused by various kinds of settings when generating packets using the packet generation unit 1036, if generation of one packet suffice, it can be considered that the processing can efficiently be executed by the sub CPU 1031.

In addition, when generating the packet by the sub CPU 1031 in step S1405 as well, the payload sum can be used to calculate the Internet checksum.

When the buffer information of the buffer in which the payload is stored is referred to, and the effective data length and the sum calculation length are compared, it can be determined whether the payload sum can be used. If the payload sum can be used, the sub CPU 1031 executes sum calculation for the header row and adds the result and the payload sum, thereby calculating the Internet checksum. If the payload sum cannot be used, the sub CPU 1031 executes sum calculation for all data rows of the header and the payload, thereby calculating the Internet checksum.

Furthermore, the payload sum can be used in a case in which a packet is generated using data stored in a plurality of buffers as the payload of one packet as well. If the payload sum of each buffer can be used, the payload sum of the packet can be calculated only by adding the payload sums.

In step S1406, the packet generated in step S1404 or S1405 is transmitted to the network 1050 via the LAN control unit 1038 or the WLAN control unit 1039.

In step S1407, the sub CPU 1031 recalculates the data size in the network buffer 1033 after the packet is transmitted in step S1406. That is, the sub CPU 1031 calculates the length of untransmitted data after the packet transmission. The untransmitted data length remaining after the packet transmission can be calculated by subtracting the execution size decided in step S1402 from the data size copied to the network buffer 1033.

In step S1408, it is determined whether the data size (a length of untransmitted data) in the network buffer 1033, which is recalculated in step S1407, is larger than the MSS of the connection used for the packet transmission. If the data size (length of untransmitted data) recalculated in step S1407 is larger than the MSS (YES in step S1408), the process returns to S1402 to repeat the packet transmission processing in steps S1403 to S1408. On the other hand, if the data size recalculated in step S1407 is equal to or smaller than the MSS (NO in step S1408), the process advances to step S1409 to finish the processing procedure shown in FIG. 14 and end the packet transmission processing once.

If the data size recalculated in step S1407 is equal to or smaller than the MSS, the process advances to step S1409 to finish the packet transmission processing. This makes it possible to confirm reception of a new send( ) call from the application or an acknowledgement (ACK) transmitted from the counterparty communication apparatus. Hence, when the transmission processing is ended once without continuously transmitting all the user data stored in the network buffer 1033, the packet transmission can efficiently be implemented, and the packet transmission throughput of the entire communication apparatus 1000 can be improved.

For example, assume a case in which a send( ) call is newly executed from another application for the same connection. In this case, more efficient packet transmission can be performed by collectively starting the packet transmission processing after the copy of the user data to the network buffer 1033 by the new send( ) call is executed.

In addition, when ACK reception processing is performed, the window size recovers. For this reason, for example, even in a case in which a large amount of user data still remains in the network buffer 1033, and the window size is narrowed, when the process of step S1408 is executed, the packet transmission can effectively be executed using the expanded window size.

As described above, after the sub CPU 1031 decides the execution size of plural packet generation processing (step S1402), the processes of steps S1403 to S1409 are executed in accordance with the decided execution size. This can further reduce the load of the plural packet generation processing and speed up the packet transmission.

<Details of Execution Size Decision Processing in Plural Packet Generation Processing>

Figure 15:
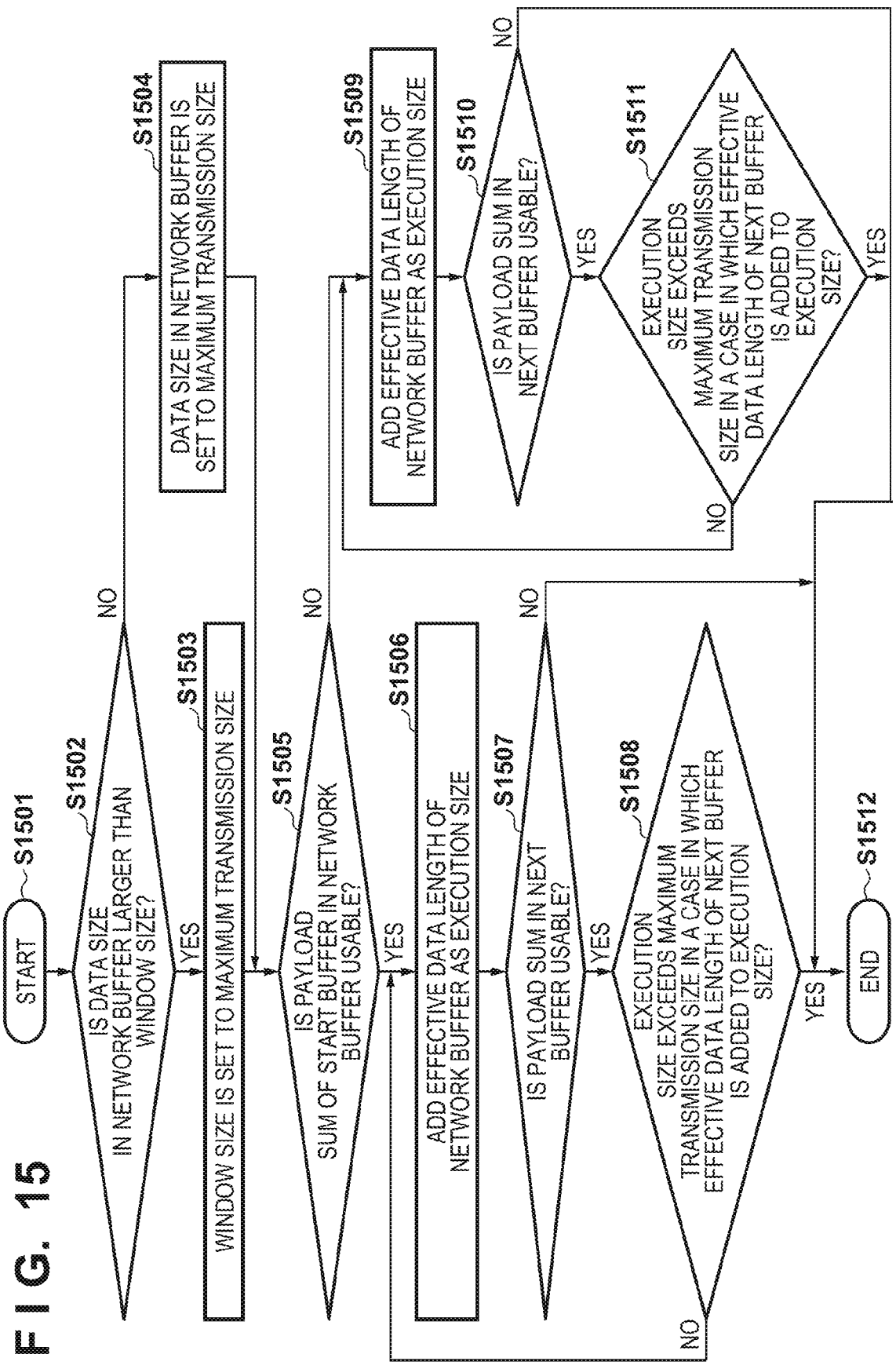
FIG. 15 is a flowchart showing an example of the detailed processing procedure of execution size decision processing executed by a packet generation unit 1036 in FIG. 14.

FIG. 15 is a flowchart showing an example of details of the processing of deciding the execution size in the plural packet generation processing (for example, TSO processing) executed by the sub CPU 1031. The processing shown in FIG. 15 shows details of the process of step S1402 shown in FIG. 14.

After the data transfer unit 1034 copies the user data to the network buffer 1033 (step S1345 in FIG. 13), and the sub CPU 1031 ensures the network buffer as the header output area for the packet generation unit 1036 (step S1348), the sub CPU 1031 starts the packet transmission processing in step S1501.

In step S1502, the sub CPU 1031 compares the window size with the size of the user data copied to the network buffer 1033. If the size of the user data in the network buffer 1033 is larger than the window size (YES in step S1502), the process advances to step S1503. On the other hand, if the size of the user data in the network buffer 1033 is equal to or smaller than the window size (NO in step S1502), the process advances to step S1504.

As for the window size to be compared with the user data size in step S1502, a transmission window size set for the TCP connection to transmit a packet is compared with a congestion window size, and a smaller one of the two is used as the window size.

In steps S1503 and S1504, a maximum transmission size in the TCP connection to transmit a packet is decided. More specifically, if the user data size in the network buffer 1033 is larger than the window size, the window size decided in step S1502 is set to the maximum transmission size. That is, the window size in the communication protocol such as TCP is set to the upper limit of the maximum transmission size.

On the other hand, if the transmission data size in the network buffer 1033 is equal to or smaller than the window size, the size of the user data existing in the network buffer 1033 is directly set to the maximum transmission size.

In step S1505, the sub CPU 1031 determines whether a payload sum stored as buffer information in the start buffer of the network buffer 1033 can be used. More specifically, the sub CPU 1031 can refer to the buffer information in the start buffer, and compare the effective data length and the sum calculation length, thereby determining whether the stored payload sum can be used.

If the effective data length and the sum calculation length match in step S1505 (YES in step S1505), the sub CPU 1031 determines that the payload sum stored in the buffer information can be used, and advances to step S1506. On the other hand, if the effective data length and the sum calculation length do not match (NO in step S1505), the sub CPU 1031 determines that the payload sum cannot be used, and advances to step S1509.

When the payload sum is speculatively calculated at the same time as the data transfer to the network buffer 1033 in step S1345 of FIG. 13, and the buffer information is updated in step S1347, the effective data length and the sum calculation length for data in a given buffer should match.

However, an example of a case in which the two values of the effective data length and the sum calculation length do not match is retransmission in the TCP communication. In the TCP communication, for data transmitted from the transmitting side, the receiving side needs to return a response representing that the data was received. This response is generally called an acknowledgement (ACK). The transmitting side packetizes the data of a portion for which the ACK cannot be received again and transmits the packet. When retransmitting the data, the start of the retransmission data is not always located at the start of the data area of the buffer in the network buffer 1033 and may be located in the middle. In this case, a data offset is set in the buffer information. When the data offset is applied, the effective data length of the untransmitted data in the buffer becomes smaller than the sum calculation length. Alternatively, in this case, the value of the effective data length in the buffer information may be updated to the data length of the length of untransmitted data.

Additionally, in a case in which the data cannot be transmitted only up to the middle each buffer of the network buffer 1033 due to the limitation of the window size as well, the effective data length and the sum calculation length of the buffer do not match.

In the above description, it is determined, based on the comparison between the effective data length and the sum calculation length, whether the payload sum is usable. However, the embodiment is not limited to this and may be implemented by another determination method.

For example, if the ACK is received for the transmission of data up to the middle of the buffer, and the ACK is not received for the subsequent data in the buffer, as in the above-described retransmission, the data offset in the buffer information of the buffer is set. In this case, for example, the sum in the buffer information of the buffer can be cleared to 0 at the same time as the setting of the data offset. Since the sum value never becomes all zero, the sub CPU 1031 can easily determine, only by confirming the value of the sum in the buffer information, whether the payload sum can be used at the time of packet generation.

In any case, in step S1505, the sub CPU 1031 can determine whether the payload sum calculated in advance can be used based on whether the data length of the target data for which the payload sum is calculated matches the length of untransmitted data. The data length of the target data for which the payload sum is calculated can be acquired by referring to the sum calculation length in the buffer information of a certain buffer. In addition, the length of untransmitted data can be acquired by referring to the effective data length and the data offset in the buffer information of the buffer. The length of untransmitted data is the payload length of each of the plurality of packets to be generated by the packet generation unit 1036.

Upon determining in step S1505 that the payload sum in the start buffer of the network buffer 1033 can be used, in step S1506, the sub CPU 1031 adds the effective data length of the start buffer of the network buffer 1033 as the execution size. That is, in step S1506, the effective data length of the data in the start buffer for which the payload sum is determined to be usable is set to the execution size.

In step S1507, the sub CPU 1031 refers to the buffer represented by the next buffer address in the buffer information of the start buffer of the network buffer 1033 and determines whether the payload sum can be used, as in step S1505. Upon determining that the checksum is usable even in the next buffer (YES in step S1507), the process advances to step S1508. On the other hand, upon determining that the payload sum is not usable in the next buffer (NO in step S1507), the process advances to step S1512 to end the processing.

Upon determining that the payload sum is usable even in the next buffer, the sub CPU 1031 determines, in step S1508, whether the execution size exceeds the maximum transmission size decided in step S1503 or S1504 in a case in which the effective data length of the next buffer is added to the execution size. In a case in which the execution size does not exceed the maximum transmission size even if the effective data length of the next buffer is added to the current execution size, the process returns to S1506 to actually add the effective data length of the next buffer to the current execution size. On the other hand, in a case in which the execution size exceeds the maximum transmission size when the effective data length of the next buffer is added to the current execution size, the process advances to step S1512 to end the processing.

From then on, if it is determined in step S1505 that the payload sum in the start buffer can be used, loop processing is executed in steps S1506 to S1508 until a buffer with an unusable payload sum exists, or the execution size exceeds the maximum transmission size. If a condition to finish the loop is satisfied, the processing procedure shown in FIG. 15 ends in step S1512. A final execution size is output and set in the packet generation unit 1036.

When the loop processing in steps S1506 to S1508 is executed, a value obtained by adding only the effective data lengths of a plurality of data in a plurality of continuous buffers for which the payload sum is determined to be usable is acquired as the execution size. In addition, for example, if the maximum transmission size has a size margin less than the effective data length of the next buffer, the execution size is decided without including the effective data length of the next buffer in the execution size. When the execution size is decided as in steps S1506 to S1508 and instructed to the packet generation unit 1036, the packet generation unit 1036 generates a plurality of packets using, as the execution size, the added value of the effective data lengths of the plurality of buffers for which payload sum recalculation is unnecessary. In this case, the packet generation unit 1036 need not recalculate the payload sum for any payload when generating the plurality of packets. Hence, the data stored in the buffer of the network buffer 1033 is not divisionally transmitted, the use efficiency of the already calculated payload sum improves, and the load concerning the payload sum recalculation is reduced.

On the other hand, when the process returns to S1505, and it is determined that the payload sum in the start buffer of the network buffer 1033 cannot be used, in step S1509, the sub CPU 1031 adds the effective data length of the start buffer of the network buffer 1033 as the execution size. That is, in step S1509, the effective data length of the data in the start buffer for which the payload sum is determined to be unusable is set to the execution size.

In step S1510, the sub CPU 1031 refers to the buffer represented by the next buffer address in the buffer information of the start buffer of the network buffer 1033 and determines whether the payload sum can be used, as in step S1505. Upon determining that the payload sum cannot be used even in the next buffer (YES in step S1510), the process advances to step S1511. On the other hand, upon determining that the payload sum is usable in the next buffer (NO in step S1510), the process advances to step S1512 to end the processing.

Upon determining that the payload sum cannot be used even in the next buffer, the sub CPU 1031 determines, in step S1511, whether the execution size exceeds the maximum transmission size decided in step S1503 or S1504 in a case in which the effective data length of the next buffer is added to the execution size. In a case in which the execution size does not exceed the maximum transmission size even if the effective data length of the next buffer is added to the current execution size, the process returns to S1509 to actually add the effective data length of the next buffer to the current execution size. On the other hand, in a case in which the execution size exceeds the maximum transmission size when the effective data length of the next buffer is added to with the current execution size, the process advances to step S1512 to end the processing.

From then on, if it is determined in step S1505 that the payload sum in the start buffer cannot be used, loop processing is executed in steps S1509 to S1511 until a buffer with a usable payload sum exists, or the execution size exceeds the maximum transmission size. If a condition to finish the loop is satisfied, the processing procedure shown in FIG. 15 ends in step S1512, and a final execution size is decided.

When the loop processing in steps S1509 to S1511 is executed, a value obtained by adding only the effective data lengths of a plurality of data in a plurality of continuous buffers for which the payload sum is determined to be unusable is acquired as the execution size. When the execution size is decided as in steps S1509 to S1511 and instructed to the packet generation unit 1036, the packet generation unit 1036 generates a plurality of packets using, as the execution size, the added value of the effective data lengths of the plurality of buffers for which payload sum recalculation is necessary. In this case, when generating a plurality of packets, the packet generation unit 1036 need not calculate the payload sum for a payload that does not need payload sum recalculation. Hence, the data stored in the buffer of the network buffer 1033 is not divisionally transmitted, the use efficiency of the already calculated payload sum improves, and the load concerning the payload sum recalculation is reduced.

Note that if it is determined in step S1505 that the payload sum in the start buffer cannot be used, the execution size may be calculated while setting the decided maximum transmission size as the upper limit without determining in step S1510 whether the payload sum in the next buffer is usable. For example, there is a case in which a buffer with a usable payload sum and a buffer with an unusable payload sum alternately exist in the network buffer 1033. In this case, when it is not determined each time in step S1510 for the next buffer whether the payload sum can be used, generation of a plurality of packets can be executed more efficiently.

As described above, according to this embodiment, when transferring data from the application to the transmission buffer, the communication apparatus 1000 speculatively calculates the payload sum of the data to be transmitted, adds the calculated checksum to the corresponding data, and stores it in the transmission buffer. Additionally, in this embodiment, when generating headers to be added to a plurality of packets generated from data to be transmitted, which is read out from the transmission buffer, the communication apparatus 1000 determines whether the speculatively calculate payload sum can be used in the generation of the headers to be added to the packets. In accordance with the result of determining whether the payload sum calculated in advance can be used or not, communication apparatus 1000 variably decides the data length to be processed in the generation of the plurality of packets. For example, the communication apparatus 1000 decides the data length to be processed in the generation of the plurality of packets so data that needs recalculation of the payload sum and data that does not need recalculation of the payload sum do not coexist.

Since this reduces unnecessary recalculation of a payload sum, it is possible to reduce a load in the calculation of the payload sum of data to be transmitted and more efficiently generate a packet.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-238920, filed Dec. 13, 2017, Japanese Patent Application No. 2018-048725, filed Mar. 16, 2018, and Japanese Patent Application No. 2018-144954, filed Aug. 1, 2018, which are hereby incorporated by reference herein in their entirety.

What is claimed is:

1. A DMA (Direct Memory Access) transfer apparatus included in a communication apparatus that comprises i) at least one processor and ii) a control hardware, that is capable of connecting data, and that packetizes and transmits data, the DMA transfer apparatus comprising:
a first calculation unit configured to perform first checksum calculation in a case where a transfer instruction is received from the at least one processor;
a second calculation unit configured to perform second checksum calculation different from the first checksum calculation in a case where the transfer instruction is received from the control hardware; and
a transfer unit configured to transfer checksum data obtained via the calculation by one of the first calculation unit and the second calculation unit to an area of the memory corresponding to a transfer destination address,
wherein the calculation by the second calculation unit is performed in response to the control hardware transmitting the transfer instruction for transferring the data and other data, in a case where it is determined by the at least one processor that a connection between the data and other data is needed.

2. The apparatus according to claim 1, wherein a calculation amount of the first checksum calculation is smaller than that of the second checksum calculation.

3. The apparatus according to claim 1, wherein the first checksum calculation is a sum of 1's complements for every 16-bit word, and the second checksum calculation is a 1's complement of the sum of 1's complements for every 16-bit word.

4. The apparatus according to claim 1, wherein the calculation by the second calculation unit is performed by the al least one processor reading out the first checksum from a memory and the al least one processor calculating the second checksum using the read first checksum, in a case where it is determined by the al least one processor that a connection between the data and other data is not needed.

5. The apparatus according to claim 1, further comprising:
an acquisition unit configured to acquire information including a transfer source address and the transfer destination address based on a received transfer instruction; and
a selection unit configured to select one of the first calculation unit and the second calculation unit;
wherein the first calculation unit performs the first checksum calculation for data from an area of a memory corresponding to the transfer source address, and
the second calculation unit performs the second checksum calculation for the data from the area of the memory corresponding to the transfer source address.

6. The apparatus according to claim 5, wherein the selection unit selects one of the first calculation unit and the second calculation unit based on an issuance source of the transfer instruction.

7. The apparatus according to claim 5, further comprising a register,
wherein the selection unit selects one of the first calculation unit and the second calculation unit based on a value set in the register.

8. The apparatus according to claim 7,
wherein the selection unit selects the first calculation unit in a case where the transfer instruction is received from the at least one processor, and selects the second calculation unit in a case where the transfer instruction is received from the control hardware.

9. A communication apparatus including the DMA transfer apparatus described in claim 7, the at least one processor, and the control hardware, wherein in a case where the at least one processor determines that a connection between the data and other data is not needed, the at least one processor issues the transfer instruction to the DMA transfer apparatus, and in a case where the at least one processor determines that a connection between the data and other data is needed, the control hardware issues the transfer instruction to the DMA transfer apparatus.

10. A communication apparatus including the DMA transfer apparatus described in claim 1, the at least one processor, and the control hardware, wherein in a case where the at least one processor determines that a maximum data size that enables packetizing and transmission of the data is not changed, the at least one processor issues the transfer instruction to the DMA transfer apparatus, and in a case where the at least one processor determines that the maximum data size is changed, the control hardware issues the transfer instruction to the DMA transfer apparatus.

11. A communication apparatus including the DMA transfer apparatus described in claim 1, the at least one processor, and the control hardware, wherein after transmission of a communication packet in which the data is packetized,
    in a case where the at least one processor determines to retransmit the communication packet, the at least one processor issues the transfer instruction to the DMA transfer apparatus, and in a case where the at least one processor determines to retransmit a part of the communication packet, the control hardware issues the transfer instruction to the DMA transfer apparatus.

12. A communication apparatus including the DMA transfer apparatus described in claim 1, the at least one processor, and the control hardware, wherein in a case where the transfer unit needs to copy the data to an area of a memory corresponding to a transfer destination address, the at least one processor issues the transfer instruction to the DMA transfer apparatus, and in a case where the copy is not needed, the control hardware issues the transfer instruction to the DMA transfer apparatus.

13. A method of controlling a DMA (Direct Memory Access) transfer apparatus included in a communication apparatus that comprises i) at least one processor and ii) a control hardware, that is capable of connecting data, and that packetizes and transmits data, the method comprising:
    performing first checksum calculation in a case where a transfer instruction is received from the at least one processor or performing second checksum calculation different from the first checksum calculation in a case where the transfer instruction is received from the control hardware; and
    transferring checksum data obtained via the first checksum calculation or the second checksum calculation to an area of the memory corresponding to a transfer destination address,
    wherein the second checksum calculation is performed in response to the control hardware transmitting the transfer instruction for transferring the data and other data, in a case where it is determined by the at least one processor that a connection between the data and other data is needed.

14. A non-transitory computer-readable storage medium storing a computer program for causing a computer to execute a method of controlling a DMA (Direct Memory Access) transfer apparatus included in a communication apparatus that comprises i) at least one processor and ii) a control hardware, that is capable of connecting data, and that packetizes and transmits data, the method comprising:
    performing first checksum calculation in a case where a transfer instruction is received from the at least one processor or performing second checksum calculation different from the first checksum calculation in a case where the transfer instruction is received from the control hardware; and
    transferring checksum data obtained via the first checksum calculation or the second checksum calculation to an area of the memory corresponding to a transfer destination address,
    wherein the second checksum calculation is performed in response to the control hardware transmitting the transfer instruction for transferring the data and other data, in a case where it is determined by the at least one processor that a connection between the data and other data is needed.

\* \* \* \* \*